United States Patent
Jung et al.

(10) Patent No.: US 9,666,259 B1
(45) Date of Patent: May 30, 2017

(54) DUAL MODE SENSING SCHEME

(71) Applicants: QUALCOMM Incorporated, San Diego, CA (US); Industry-Academic Cooperation Foundation, Yonsei University, Seoul (KR)

(72) Inventors: Seong-Ook Jung, Seoul (KR); Taehui Na, Seoul (KR); Byung Kyu Song, Seoul (KR); Jung Pill Kim, San Diego, CA (US); Seung Hyuk Kang, San Diego, CA (US)

(73) Assignees: QUALCOMM Incorporated, San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 15/097,166

(22) Filed: Apr. 12, 2016

(51) Int. Cl.
*G11C 11/16* (2006.01)

(52) U.S. Cl.
CPC ...... *G11C 11/1673* (2013.01); *G11C 11/1675* (2013.01)

(58) Field of Classification Search
CPC .................. G11C 11/1673; G11C 11/1675
USPC ....................................................... 365/158
See application file for complete search history.

(56) References Cited

U.S. PATENT DOCUMENTS

| 6,621,739 B2 | 9/2003 | Gonzalez et al. |
| 7,130,235 B2 | 10/2006 | Perner |
| 8,654,595 B2 * | 2/2014 | Kim .................. G11C 5/145 365/148 |
| 8,891,326 B1 | 11/2014 | Abedifard et al. |
| 9,025,364 B2 | 5/2015 | Kinney et al. |
| 2009/0135642 A1* | 5/2009 | Kim .................. G11C 7/062 365/148 |
| 2010/0128519 A1* | 5/2010 | Li ...................... G11C 11/16 365/171 |
| 2013/0329488 A1* | 12/2013 | Abedifard ......... G11C 11/1673 365/158 |

(Continued)

OTHER PUBLICATIONS

Na, T., et al., "A Double-Sensing-Margin Offset-Canceling Dual-Stage Sensing Circuit for Resistive Nonvolatile Memory," IEEE Transactions on Circuits and Systems-II: Express Briefs, Dec. 2015, vol. 62, Issue 12, IEEE, Piscataway, NJ, 1109-1113.

(Continued)

*Primary Examiner* — Huan Hoang
*Assistant Examiner* — Muna A Techane
(74) *Attorney, Agent, or Firm* — Kenneth K. Vu; Joseph Agusta

(57) ABSTRACT

A method of sensing a data value stored at a memory cell according to a dual mode sensing scheme includes determining, at a sensing circuit, whether a resistance of a magnetic tunnel junction (MTJ) element is within a first range of resistance values, within a second range of resistance values, or within a third range of resistance values. The MTJ element is included in the memory cell. The method also includes determining the data value stored at the memory cell according to a first mode of operation if the resistance of the MTJ element is within the first range of resistance values or within the third range of resistance values. The method further includes determining the data value stored at the memory cell according to a second mode of operation if the resistance of the MTJ element is within the second range of resistance values.

30 Claims, 14 Drawing Sheets

(56) References Cited

U.S. PATENT DOCUMENTS

| | | | |
|---|---|---|---|
| 2014/0003137 A1* | 1/2014 | Noshiro | G11C 11/5607 365/158 |
| 2014/0269029 A1* | 9/2014 | Kinney | G11C 11/1673 365/158 |
| 2015/0036421 A1* | 2/2015 | Kim | G11C 11/1673 365/158 |

OTHER PUBLICATIONS

Chen, Y., et al., "A 130 nm 1.2 V/3.3 V 16 Kb Spin—Transfer Torque Random Access Memory With Nondestructive Self-Reference Sensing Scheme," Journal of Solid-State Circuits, Feb. 2012, vol. 47, Issue 2, IEEE, Piscataway, NJ, pp. 560-573.

Jeong, G., et al., "A 0.24/spl mu/m 2.0V 1T1MTJ 16kb NV Magnetoresistance RAM with Self Reference Sensing," IEEE International Solid-State Circuits Conference, ISSCC, Feb. 2003, vol. 1, 8 pages.

Motaman, S., et al., "A Novel Slope Detection Technique for Robust STTRAM Sensing," Symposium on Low Power Electronics and Design, Jul. 2015, IEEE, Piscataway, NJ, pp. 7-12.

Kim, J., et al., A Novel Sensing Circuit for Deep Submicron Spin Transfer Torque MRAM (STT-MRAM), IEEE Transactions on Very Large Scale Integration (VLSI) Systems, Jan. 2012, vol. 20, Issue 1, IEEE, Piscataway, NJ, 181-186.

\* cited by examiner

DUAL MODE SENSING SCHEME

I. FIELD

The present disclosure is generally related to a sensing scheme for a memory device.

II. DESCRIPTION OF RELATED ART

Advances in technology have resulted in smaller and more powerful computing devices. For example, there currently exist a variety of portable personal computing devices, including wireless telephones, such as mobile and smart phones, tablets and laptop computers that are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing capabilities.

Wireless telephones and other electronic devices may include memory devices to store information. Each memory device may include a plurality of memory cells. A sensing circuit may be used to sense (e.g., read) a data value stored at a particular memory cell. For example, the sensing circuit may sense whether a logical "0" data value is stored at the particular memory cell or whether a logical "1" data value is stored at the particular memory cell. To sense the data value, the sensing circuit may compare a resistance of a resistive memory element in the particular memory cell to one or more reference elements.

As technology nodes scale down (e.g., sub-45 nanometer (nm) technology nodes), a read yield for sensing circuits may be limited by variations of the one or more reference elements. To illustrate, the one or more reference elements may include a low-resistance element and a high-resistance element. As current increases, the resistance of the high-resistance element may decrease, which may reduce the resistance difference between the low-resistance element and the high-resistance element. The reduction in resistance difference may decrease the read yield of the sensing circuit. A data-cell-variation-tolerant sensing scheme (DCVT-SS) may be used to improve the read yield for submicron technology nodes. However, DCVT-SSs may result in relatively large read times, relatively large energy consumption, or both, which may not be suitable for high performance and low energy applications.

III. SUMMARY

According to one implementation of the techniques disclosed herein, a method of sensing a data value stored at a memory cell according to a dual mode sensing scheme includes determining, at a sensing circuit, whether a resistance of a magnetic tunnel junction (MTJ) element is within a first range of resistance values, within a second range of resistance values, or within a third range of resistance values. The MTJ element is included in the memory cell. Resistance values within the second range of resistance values are greater than resistance values in the first range of resistance values, and resistance values in the third range of resistance values are greater than the resistance values in the second range of resistance values. A resistance of a reference resistor is within the second range of resistance values. The method also includes determining the data value stored at the memory cell according to a first mode of operation if the resistance of the MTJ element is within the first range of resistance values or within the third range of resistance values. The method further includes determining the data value stored at the memory cell according to a second mode of operation if the resistance of the MTJ element is within the second range of resistance values.

According to another implementation of the techniques disclosed herein, an apparatus for sensing a data value according to a dual mode sensing scheme includes a memory cell that includes a magnetic tunnel junction (MTJ) element. The apparatus also includes a reference cell that includes a reference resistor. The apparatus further includes a sensing circuit configured to determine whether a resistance of the MTJ element is within a first range of resistance values, within a second range of resistance values, or within a third range of resistance values. Resistance values within the second range of resistance values are greater than resistance values in the first range of resistance values, and resistance values in the third range of resistance values are greater than the resistance values in the second range of resistance values. A resistance of the reference resistor is within the second range of resistance values. The sensing circuit is also configured to determine the data value stored at the memory cell according to a first mode of operation if the resistance of the MTJ element is within the first range of resistance values or within the third range of resistance values. The sensing circuit is further configured to determine the data value stored at the memory cell according to a second mode of operation if the resistance of the MTJ element is within the second range of resistance values.

According to another implementation of the techniques disclosed herein, a non-transitory computer-readable medium includes instructions for sensing a data value stored at a memory cell according to a dual mode sensing scheme. The instructions, when executed by a processor, cause the processor to perform operations comprising determining, at a sensing circuit, whether a resistance of a magnetic tunnel junction (MTJ) element is within a first range of resistance values, within a second range of resistance values, or within a third range of resistance values. The MTJ element is included in the memory cell. Resistance values within the second range of resistance values are greater than resistance values in the first range of resistance values, and resistance values in the third range of resistance values are greater than the resistance values in the second range of resistance values. A resistance of a reference resistor is within the second range of resistance values. The operations also include determining the data value stored at the memory cell according to a first mode of operation if the resistance of the MTJ element is within the first range of resistance values or within the third range of resistance values. The operations further include determining the data value stored at the memory cell according to a second mode of operation if the resistance of the MTJ element is within the second range of resistance values.

According to another implementation of the techniques disclosed herein, an apparatus for sensing a data value stored at a memory cell according to a dual mode sensing scheme includes means for determining whether a resistance of a magnetic tunnel junction (MTJ) element is within a first range of resistance values, within a second range of resistance values, or within a third range of resistance values. The MTJ element is included in the memory cell. Resistance values within the second range of resistance values are greater than resistance values in the first range of resistance values, and resistance values in the third range of resistance values are greater than the resistance values in the second range of resistance values. A resistance of a reference resistor is within the second range of resistance values. The apparatus also includes means for determining the data value stored at the memory cell according to a first mode of operation if the resistance of the MTJ element is within the first range of resistance values or within the third range of resistance values. The apparatus further includes means for determining the data value stored at the memory cell according to a second mode of operation if the resistance of the MTJ element is within the second range of resistance values.

IV. BRIEF DESCRIPTION OF THE DRAWINGS

Figure 13:
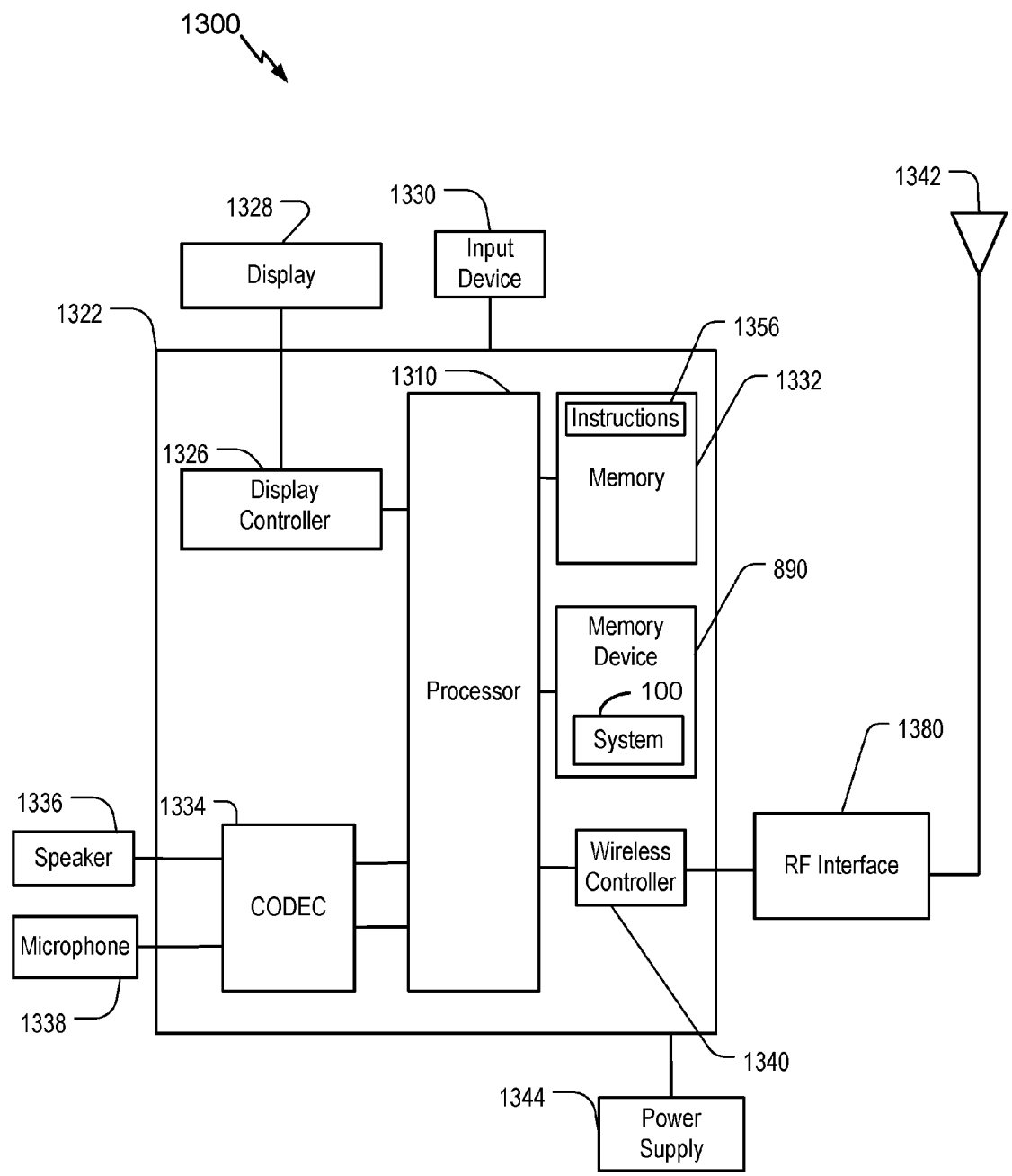
Figure 14:
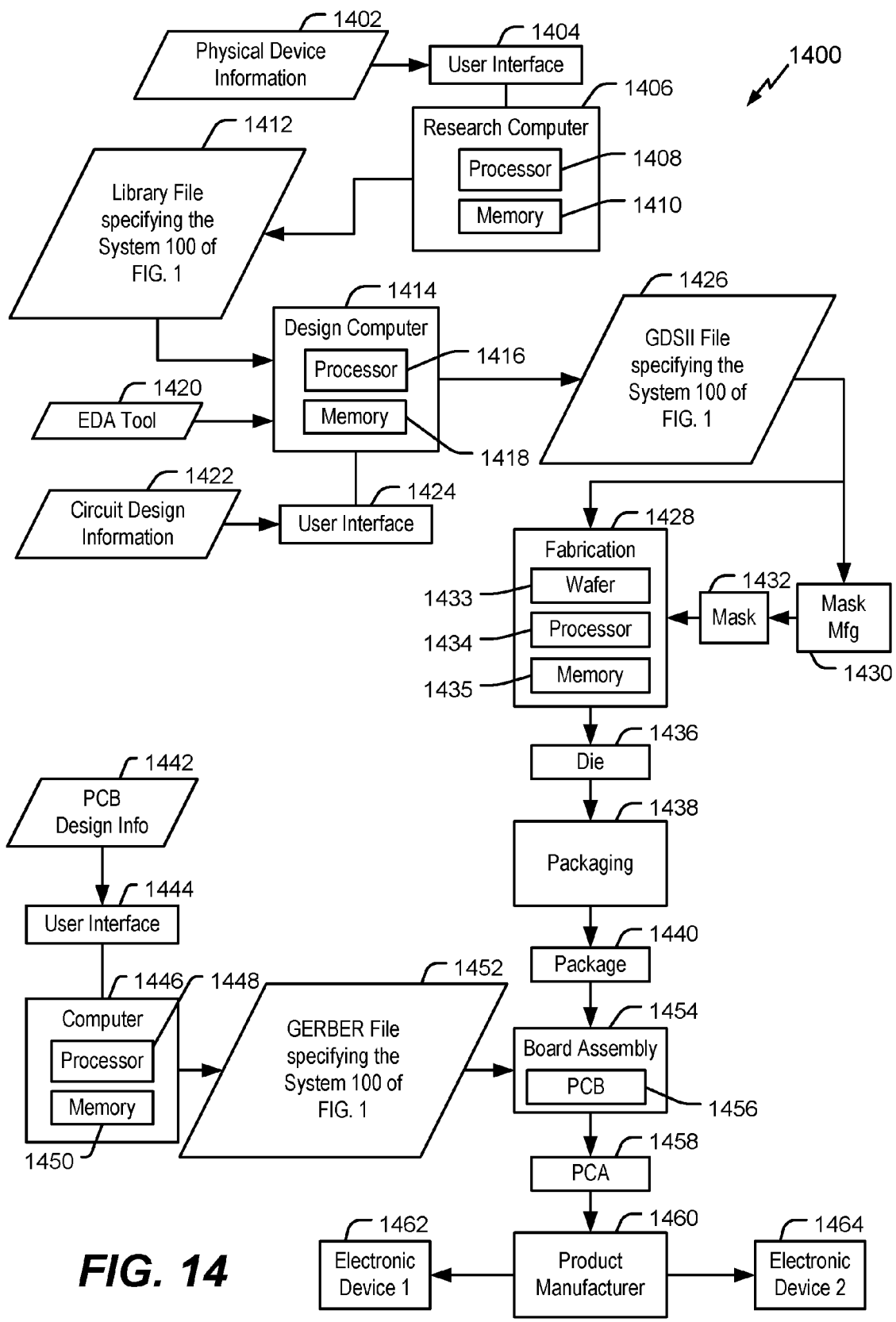

FIG. 13 is a block diagram of a device including a component operable to sense a data value of a memory cell according to a dual mode sensing scheme; and FIG. 14 is a data flow diagram of a particular illustrative implementation of a manufacturing process to manufacture electronic devices that include a component operable to sense a data value of a memory cell according to a dual mode sensing scheme.

V. DETAILED DESCRIPTION

Figure 1:
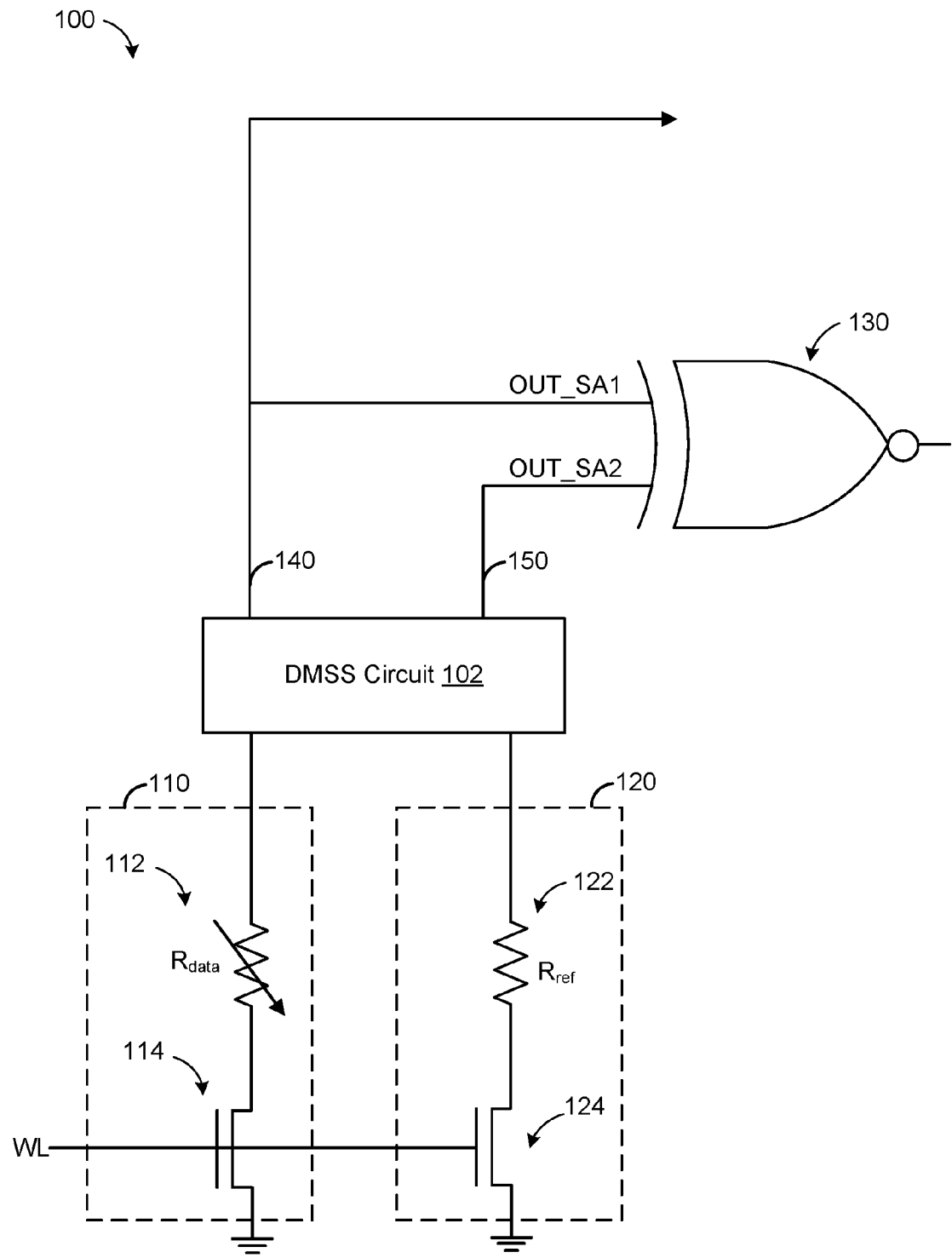
FIG. 1 illustrates a system that is operable to sense a data value of a memory cell according to a dual mode sensing scheme.

Referring to FIG. 1, a system 100 that is operable to sense a data value of a memory cell according to a dual mode sensing scheme is shown. The system 100 includes a dual mode sensing scheme (DMSS) circuit 102, a data cell 110, a reference cell 120, and logic circuitry. According to FIG. 1, the logic circuitry includes an exclusive NOR logic gate 130. However, in other implementations, the logic circuitry may include another logic gate or a combination of logic gates.

The data cell 110 includes a magnetic tunnel junction (MTJ) element 112 and an access transistor 114. A first terminal of the MTJ element 112 is coupled to the DMSS circuit 102, and a second terminal of the MTJ element 112 is coupled to a drain of the access transistor 114. The MTJ element 112 may have a data cell resistance ($R_{data}$) that depends on a data value stored by the data cell 110. During a read operation, a voltage across the data cell 110 may be responsive to a read current and may be proportional to the data cell resistance ($R_{data}$). As described below, the data value stored at the data cell 110 may be determined based on the voltage across the data cell 110 during the read operation. According to one implementation, the access transistor 114 is an n-type metal oxide semiconductor (NMOS) transistor. A source of the access transistor 114 is coupled to ground, and a gate of the access transistor 114 is coupled to a word line (WL).

The reference cell 120 includes a reference resistor 122 and an access transistor 124. Although the reference cell 120 is shown to include the reference resistor 122, in other implementations, the reference cell 120 may include other reference elements, such as a reference MTJ element. A first terminal of the reference resistor 122 is coupled to the DMSS circuit 102, and a second terminal of the reference resistor 122 is coupled to a drain of the access transistor 124. The reference resistor 122 may have a reference cell resistance ($R_{ref}$). A voltage across the reference cell 120 may be responsive to a read current and may be proportional to the reference cell resistance ($R_{ref}$). According to one implementation, the access transistor 124 is an NMOS transistor. A source of the access transistor 124 is coupled to ground, and a gate of the access transistor 124 is coupled to the word line (WL).

The DMSS circuit 102 may be configured to determine whether the data cell 110 stores a logical "0" data value or a logical "1" data value. To illustrate, a logical high voltage may be applied to the word line (WL) to activate the access transistors 114, 124. When the access transistors 114, 124 are activated, a first current may propagate through the data cell 110 and a second current may propagate through the reference cell 120. For example, the first current may propagate from the DMSS circuit 102 through the MTJ element 112 and the access transistor 114 to ground, and the second current may propagate from the DMSS circuit 102 through the reference resistor 122 and the access transistor 124 to ground.

The DMSS circuit 102 may be configured to compare a memory voltage (e.g., the voltage across the data cell 110) to a reference voltage (e.g., the voltage across the reference cell 120). The memory voltage may be approximately equal to the sum of the data cell resistance ($R_{data}$) and the resistance across the access transistor 114 multiplied by the first current. The reference voltage may be approximately equal to the sum of the reference cell resistance ($R_{ref}$) and the resistance across the access transistor 124 multiplied by the second current. According to one implementation, a magnitude of the first current may be approximately equal to a magnitude of the second current, and the resistance across the access transistor 114 may be substantially similar to the resistance across the access transistor 124. Thus, the difference between memory voltage and the reference voltage may be based on the difference between the data cell resistance ($R_{data}$) and the reference cell resistance ($R_{ref}$). If the memory voltage is greater than the reference voltage, the data cell 110 stores a logical "1" data value. If the memory voltage is less than the reference voltage, the data cell 110 stores a logical "0" data value.

The DMSS circuit 102 may be configured to sense the data value stored at the data cell 110 according to a first mode (e.g., a "normal" mode) or according to a second mode (e.g., an "exception" mode). As described in greater detail with respect to FIG. 2, the DMSS circuit 102 may determine whether the data cell resistance ($R_{data}$) is within a first range of resistance values, within a second range of resistance values, or within a third range of resistance values. The resistance values within the second range of resistance values are greater than the resistance values in the first range of resistance values, and the resistance values in the third range of resistance values are greater than the resistance values in the second range of resistance values. The reference cell resistance ($R_{ref}$) may be within the second range of resistance values.

To determine the range of resistance values that the data cell resistance ($R_{data}$) is within, the DMSS circuit 102 may generate a first sensed output (OUT_SA1) 140 and a second sensed output (OUT_SA2) 150. Generation of the sensed output (OUT_SA1, OUT_SA2) is described in greater detail with respect to FIGS. 4-6. The first sensed output 140 may be provided to a first terminal of the exclusive NOR logic gate 130, and the second sensed output 150 may be provided to a second terminal of the exclusive NOR logic gate 130. If the first sensed output 140 is different from the second sensed output 150, the DMSS circuit 102 may determine that the data cell resistance ($R_{data}$) is within the first or third range of resistance values and may sense the data value according to the first mode. The first mode is described in greater detail with respect to FIGS. 4-6. If the result of performing an exclusive NOR operation at the exclusive NOR logic gate 130 is a logical "0", the DMSS circuit 102 may sense the data value according to the first mode. According to the first mode, the first sensed output 140 is used to determine the data value stored at the data cell 110. For example, if the voltage of the first sensed output 140 is greater than the voltage of the second sensed output 150, the data value stored at the data cell 110 may be a logical "1". Alternatively, if the voltage of the first sensed output 140 is less than the voltage of the second sensed output 150, the data value stored at the data cell 110 may be a logical "0".

If the first sensed output 140 is the same as the second sensed output 150, the DMSS circuit 102 may determine that the data cell resistance ($R_{data}$) is within the second range of resistance values and may sense the data value according to the second mode. According to the second mode, a data-cell-variation-tolerant sensing scheme (DCVT-SS) is used to sense the data value stored at the data cell 110. The DCVT-SS is described in greater detail with respect to FIGS. 7-11. As described below, the second mode may require relatively long sensing times and energy consumption when compared to the first mode.

The system 100 of FIG. 1 may reduce the relatively long sensing times and energy consumption associated with the second mode of operation by only sensing the data cell 110 according to the second mode of operation when the data value of the first sensed output 140 is the same as a data value of the second sensed output 150. Otherwise, the data cell 110 may be sensed according to the first mode of operation (e.g., a faster mode of operation that requires less energy consumption than the second mode of operation).

Figure 2:
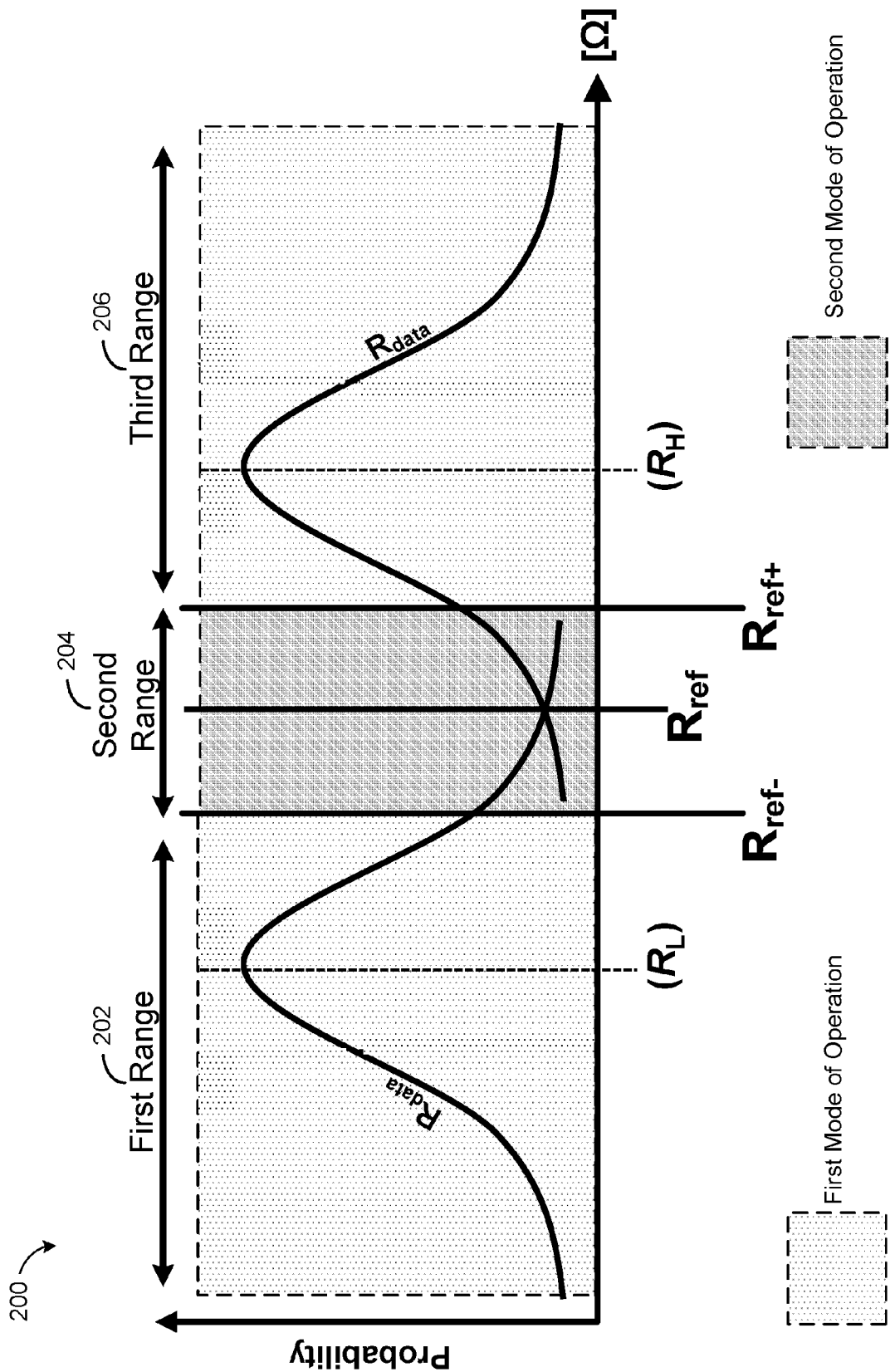
FIG. 2 depicts a graph illustrating modes of operations associated with different magnetic tunnel junction (MTJ) resistances of the memory cell of FIG. 1.

Referring to FIG. 2, a graph 200 illustrating modes of operations associated with different MTJ resistances of the data cell 110 is shown. The horizontal axis of the graph 200 illustrates different resistance values with respect to a reference cell resistance ($R_{ref}$). According to one implementation, the reference cell resistance ($R_{ref}$) along the horizontal axis may correspond to the reference cell resistance ($R_{ref}$) of the reference resistor 122. As described below, the vertical axis of the graph 200 illustrates probability values.

The graph 200 includes a trace that illustrates the probability that a data cell resistance ($R_{data}$) is equal to a particular resistance (in terms of the reference cell resistance ($R_{ref}$)). For example, the reference cell resistance ($R_{ref}$) may be a "medium" resistance that is generated by coupling "low" resistance ($R_L$) resistors and "high" resistance ($R_H$) resistors using series and parallel connections. According to the graph 200, there is a relatively high probability that the data cell resistance ($R_{data}$) is approximately equal to a low resistance ($R_L$) or approximately equal to a high resistance ($R_H$). According to the graph 200, there is a relatively low probability that the data cell resistance ($R_{data}$) is approximately equal to the reference cell resistance ($R_{ref}$).

According to the graph 200, if the data cell resistance ($R_{data}$) is approximately equal to the low resistance ($R_L$) or approximately equal to the high resistance ($R_H$), the DMSS circuit 102 may sense the data value according to the first mode of operation. For example, if the data cell resistance ($R_{data}$) is within a first range of resistance values 202 or a third range of resistance values 206, the DMSS circuit 102 may sense the data value according to the first mode of operation. To illustrate, the DMSS circuit 102 may use the first mode of operation to sense that the data value stored at the data cell 110 is a logical "0" if the data cell resistance ($R_{data}$) is approximately equal to the low resistance ($R_L$). In a similar manner, the DMSS circuit 102 may use the first mode of operation to sense that the data value stored at the data cell 110 is a logical "1" if the data cell resistance ($R_{data}$) is approximately equal to the high resistance ($R_H$).

However, if the data cell resistance ($R_{data}$) is relatively close to the reference cell resistance ($R_{ref}$), the DMSS circuit 102 may use the second mode of operation to sense the data value of the data cell 110. For example, if the data cell resistance ($R_{data}$) is within a second range of resistance values 204, the DMSS circuit 102 may use the second mode of operation to sense the data value of the data cell 110. To illustrate, if the data cell resistance ($R_{data}$) is between a first reference cell resistance ($R_{ref-}$) and a second reference cell resistance ($R_{ref+}$), the DMSS circuit 102 may use the second mode of operation to sense the data value of the data cell 110. According to the graph 200, there is a relatively low probability that the data cell resistance ($R_{data}$) is between the first and second reference cell resistance ($R_{ref-}$, $R_{ref+}$).

Thus, the graph 200 illustrates that the second mode of operation may be used rarely reduce the relatively long sensing times and energy consumption associated with the second mode of operation. For example, by only sensing the data cell 110 according to the second mode of operation when the data cell resistance ($R_{data}$) is between the first and second reference cell resistance ($R_{ref-}$, $R_{ref+}$), the relatively long sensing times and energy consumption associated with the second mode of operation may be reduced. Otherwise, the data cell 110 may be sensed according to the first mode of operation (e.g., a faster mode of operation that requires less energy consumption than the second mode of operation).

Figure 3:
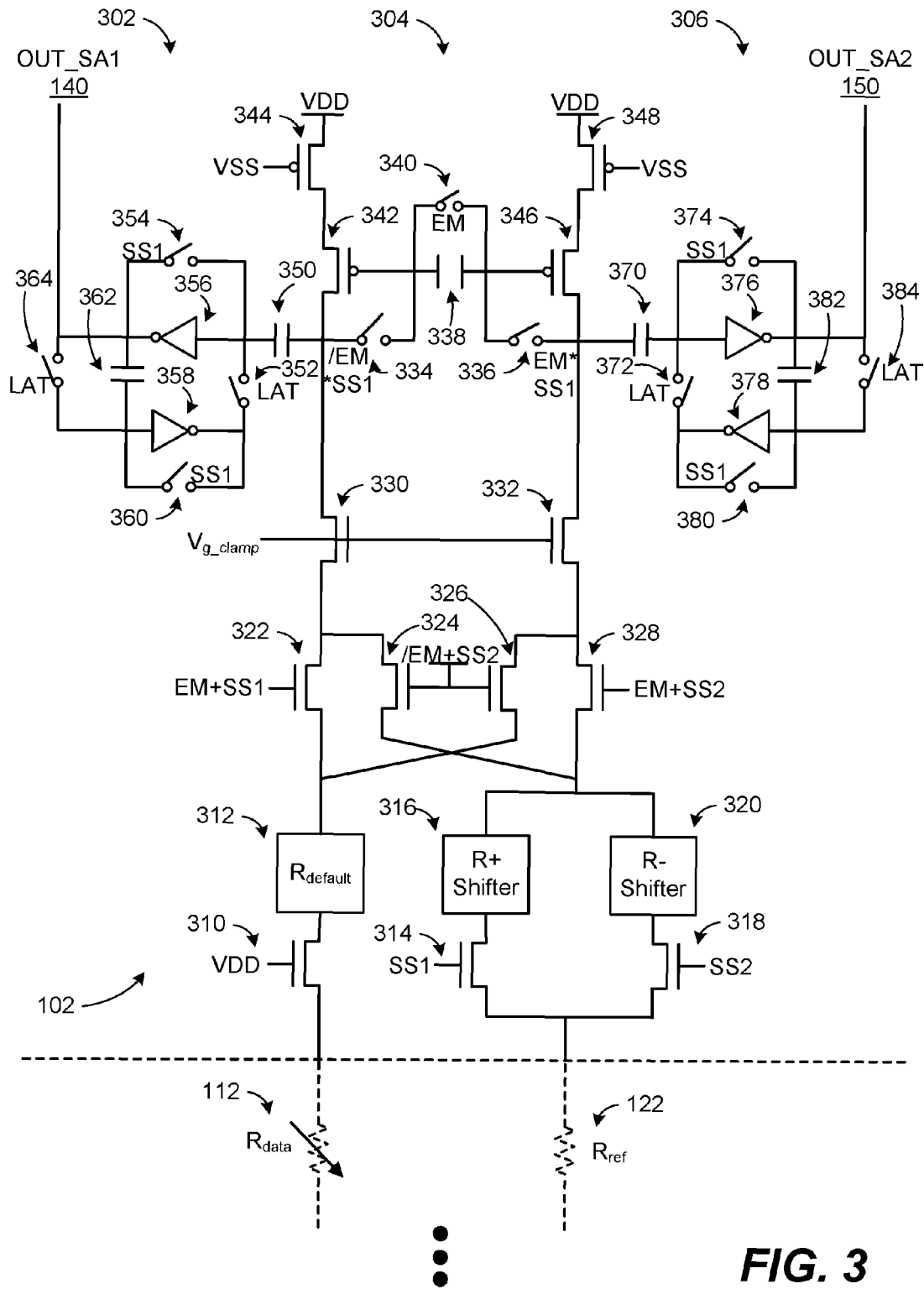
FIG. 3 illustrates a circuit diagram of a dual mode sensing scheme circuit.

Referring to FIG. 3, a circuit diagram of the DMSS circuit 102 is shown. Operation of the DMSS circuit 102 is described in greater detail with respect to FIGS. 4-11. The DMSS circuit 102 includes a first offset-canceling sense amplifier 302, an offset-canceling sensing circuit 304, and a second offset-canceling sense amplifier 306. The first offset-canceling sense amplifier 302 may be configured to generate the first sensed output (OUT_SA1) 140, and the second offset-canceling sense amplifier 306 may be configured to generate the second sensed output (OUT_SA2) 150.

The offset-canceling sensing circuit 304 includes a transistor 310 (e.g., an NMOS transistor) that is coupled to the MTJ element 112. For example, a source of the transistor 310 is coupled to the MTJ element 112, and a drain of the transistor 310 is coupled to a first terminal of a default resistive element ($R_{default}$) 312. A gate of the transistor 310 is coupled to receive a supply voltage (VDD). The offset-canceling sensing circuit 304 also includes a transistor 314 (e.g., an NMOS transistor) that is coupled to the reference resistor 122 and to a first terminal of a first resistive shift element (R+ Shifter) 316. For example, a source of the transistor 314 is coupled to the reference resistor 122, and a drain of the transistor 314 is coupled to a first terminal of the first resistive shift element 316. A gate of the transistor 314 is coupled to receive a signal (SS1). The offset-canceling sensing circuit 304 also includes a transistor 318 (e.g., an NMOS transistor) that is coupled to the reference resistor 122 and to a first terminal of a second resistive shift element (R− Shifter) 320. For example, a source of the transistor 318 is coupled to the reference resistor 122, and a drain of the transistor 318 is coupled to a first terminal of the second resistive shift element 320. A gate of the transistor 318 is coupled to receive a signal (SS2).

The offset-canceling sensing circuit 304 also includes a transistor 322, a transistor 324, a transistor 326, and a transistor 328. According to one implementation, the transistors 322, 324, 326, 328 are NMOS transistors. A source of the transistor 322 is coupled to a second terminal of the default resistive element 312 and to a source of the transistor 326. A source of the transistor 324 is coupled to a second terminal of the first resistive shift element 316 and to a second terminal of the second resistive shift element 320. A source of the transistor 328 is coupled to the second terminal of the first resistive shift element 316 and to the second terminal of the second resistive shift element 320. A gate of the transistor 324 is coupled to a gate of the transistor 326. A gate of the transistor 322 is coupled to receive a signal (EM+SS1), and a gate of the transistor 328 is coupled to receive the signal (EM+SS1). The gates of the transistors 324, 326 are coupled to receive a signal (/EM+SS2).

The offset-canceling sensing circuit 304 includes a clamp transistor 330 and a clamp transistor 332. According to one implementation, the clamp transistors 330, 332 are NMOS transistors. A source of the clamp transistor 330 is coupled to a drain of the transistor 322 and to a drain of the transistor 324. A source of the clamp transistor 332 is coupled to a drain of the transistor 326 and to a drain of the transistor 328. A gate of the clamp transistor 330 is coupled to receive a clamp voltage ($V_{g\_clamp}$) and a gate of the clamp transistor 332 is also coupled to receive the clamp voltage ($V_{g\_clamp}$).

The offset-canceling sensing circuit 304 also includes a transistor 342, a transistor 344, a transistor 346, and a transistor 348. According to one implementation, the transistors 342, 344, 346, 348 are p-type metal oxide semiconductor (PMOS) transistors. A drain of the transistor 342 is coupled to a drain of the clamp transistor 330, and a source of the transistor 342 is coupled to a drain of the transistor 344. A source of the transistor 344 is coupled to receive the supply voltage (VDD), and a gate of the transistor 344 is coupled to receive a ground voltage (VSS). A drain of the transistor 346 is coupled to a drain of the clamp transistor 332, and a source of the transistor 346 is coupled to a drain of the transistor 348. A source of the transistor 348 is coupled to receive the supply voltage (VDD), and a gate of the transistor 348 is coupled to receive the ground voltage (VSS). A gate of the transistor 342 is coupled to a first terminal (e.g., a positive terminal) of a capacitor 338, and a gate of the transistor 346 is coupled to a second terminal (e.g., a negative terminal) of the capacitor 338.

The offset-canceling sensing circuit 304 also includes a switch 334, a switch 336, a switch 340, a capacitor 350, and a capacitor 370. A first terminal (e.g., a positive terminal) of the capacitor 350 is coupled to a first terminal of the switch 334 and to the drain of the transistor 342. A second terminal of the switch 334 is coupled to a first terminal of the switch 340 and to the gate of the transistor 342. A first terminal (e.g., a positive terminal) of the capacitor 370 is coupled to a first terminal of the switch 336 and to the drain of the transistor 346. A second terminal of the switch 336 is coupled to a second terminal of the switch 340 and to the gate of the transistor 346. The switch 334 may be selectively activated by a signal (/EM*SS1), the switch 336 may be selectively activated by a signal (EM*SS1), and the switch 340 may be selectively activated by a signal (EM).

The first offset-canceling sense amplifier 302 includes a switch 352, a switch 354, an inverter 356, an inverter 358, a switch 360, a capacitor 362, and a switch 364. A second terminal of the capacitor 350 is coupled to a first terminal of the switch 352, a first terminal of the invertor 356, and a first terminal of the switch 354. A second terminal of the switch 354 is coupled to a second terminal of the inverter 356 and to a first terminal of the capacitor 362. A second terminal of the capacitor 362 is coupled to a first terminal of the inverter 358, to a first terminal of the switch 360, and to a first terminal of the switch 364. A second terminal of the switch 360 is coupled to a second terminal of the inverter 358 and to a second terminal of the switch 352. A second terminal of the switch 364 is coupled to a second terminal of the inverter 356. The switches 354, 360 may be selectively activated by the signal (SS1), and the switches 352, 364 may be selectively activated by a latch signal (LAT).

The second offset-canceling sense amplifier 306 includes a switch 372, a switch 374, an inverter 376, an inverter 378, a switch 380, a capacitor 382, and a switch 384. A second terminal of the capacitor 370 is coupled to a first terminal of the switch 372, a first terminal of the invertor 376, and a first terminal of the switch 374. A second terminal of the switch 374 is coupled to a second terminal of the inverter 376 and to a first terminal of the capacitor 382. A second terminal of the capacitor 382 is coupled to a first terminal of the inverter 378, to a first terminal of the switch 380, and to a first terminal of the switch 384. A second terminal of the switch 380 is coupled to a second terminal of the inverter 378 and to a second terminal of the switch 372. A second terminal of the switch 384 is coupled to a second terminal of the inverter 376. The switches 374, 380 may be selectively activated by the signal (SS1), and the switches 372, 384 may be selectively activated by the latch signal (LAT).

The DMSS circuit 102 may be used to sense the data value stored at the data cell 110 of FIG. 1 according to the first mode (e.g., a "normal" mode) or according to the second mode (e.g., an "exception" mode). By using the resistive shift elements 316, 320, the reference cell resistances ($R_{ref+}$, $R_{ref-}$) of FIG. 2 may be generated. For example, the first resistive shift element (R+ Shifter) 316 may have a resistance that is approximately equal to the resistance of the default resistive element ($R_{default}$) 312 plus a constant value (α). The second resistive shift element (R− Shifter) 320 may have a resistance that is approximately equal to the resistance of the default resistive element ($R_{default}$) 312 minus the constant value (α). As described with respect to FIG. 1, if the first sensed output 140 is different from the second sensed output 150, the DMSS circuit 102 may sense the data value according to the first mode, and the first sensed output 140 is used as a DMSS output to determine the data value stored at the data cell 110. If the first sensed output 140 is the same as the second sensed output 150, the DMSS circuit 102 may sense the data value according to the second mode. According to the second mode, the DCVT-SS is used to sense the data value stored at the data cell 110, as described in greater detail with respect to FIGS. 7-11.

The DMSS circuit 102 may reduce the relatively long sensing times and energy consumption associated with the second mode of operation by only sensing the data cell 110 according to the second mode of operation when the data value of the first sensed output 140 is the same as a data value of the second sensed output 150. Otherwise, the data cell 110 may be sensed according to the first mode of operation (e.g., a faster mode of operation that requires less energy consumption than the second mode of operation).

Figure 4:
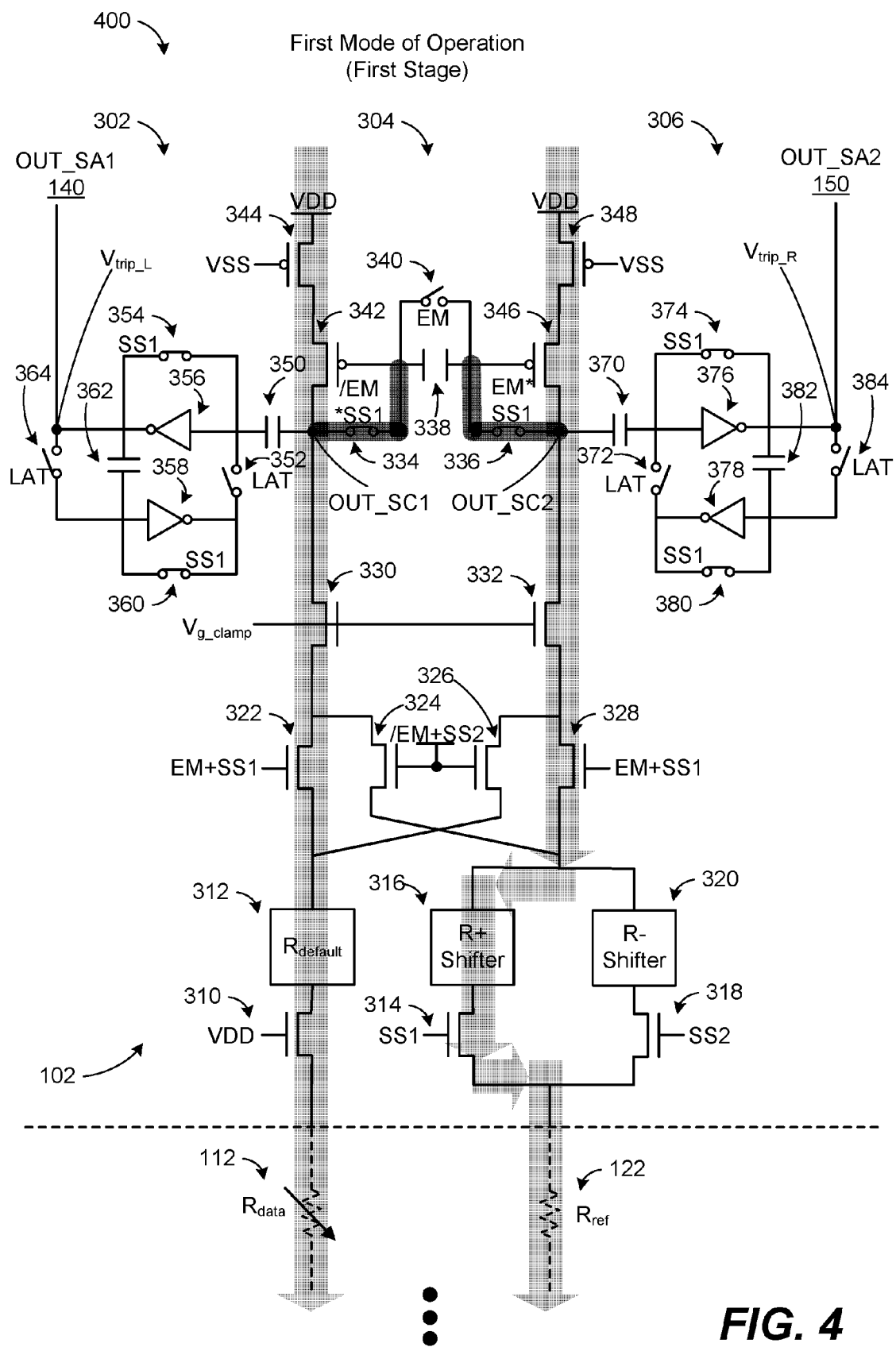
FIG. 4 illustrates a first stage of sensing the data value of the memory cell according to a first mode of operation.

Referring to FIG. 4, a first stage 400 of sensing the data value of the data cell 110 according to the first mode of operation is shown. According to the first stage 400, the signal (SS1) is set to a logical high voltage level to activate the transistor 314. Additionally, the signal (EM+SS1) is set to a logical high voltage level to activate the transistors 322, 328. The signal (SS2) and the signal (/EM+SS2) are set to logical low voltage levels to deactivate the transistors 318, 324, 326. As a result, the MTJ element 112 is connected to a left branch of the DMSS circuit 102 (as illustrated by the leftward shaded arrow), and the reference resistor 122 is connected to a right branch of the DMSS circuit 102 (as illustrated by the rightward shaded arrow).

A first voltage output (OUT_SC1) of the offset-canceling sensing circuit 304 may be approximately equal to the sum of the voltages across the clamp transistor 330, the transistor 322, the default resistive element 312, the transistor 310, the MTJ element 112, and the access transistor 114. According to the first stage 400, the first voltage output (OUT_SC1) may also be referred to as the "left branch" voltage ($V_{ref\_L}$). A second voltage output (OUT_SC2) of the offset-canceling sensing circuit 304 may be approximately equal to the sum of the voltages across the clamp transistor 332, the transistor 328, the first resistive shift element 316, the transistor 314, the reference resistor 122, and the access transistor 124. According to the first stage 400, the second voltage output (OUT_SC2) may also be referred to as the "right branch" voltage ($V_{ref\_R}$). The switches 334, 336 may be activated and the voltage outputs (OUT_SC1, OUT_SC2) may be stored at the capacitor 338 to cancel the offset of the offset-canceling sensing circuit 304.

Because the voltage outputs (OUT_SC1, OUT_SC2) are generated by diode-connected load PMOS transistors (e.g., the transistors 342, 346), the voltage outputs (OUT_SC1, OUT_SC2) may not exceed $V_{DD}$-$V_{THP}$, where $V_{THP}$ is the threshold voltage of the transistors 342, 346. Thus, the first voltage output (OUT_SC1) may be approximately equal to the second voltage output (OUT_SC2) during the first stage 400. For this reason, the capacitor 338 does not act as the load of the offset-canceling sensing circuit 304, which may result in performance improvement.

The first sensed output (OUT_SA1) 140 may be approximately equal to $V_{trip\_L}$, and the second sensed output (OUT_SA2) 150 may be approximately equal to $V_{trip\_R}$ to cancel the offset of the offset-canceling sense amplifiers 302, 306. For example, the switches 364, 384 may be deactivated and the switches 354, 374 may be activated such that the sensed outputs (OUT_SA1, OUT_SA2) are equal to $V_{trip\_L}$ and $V_{trip\_R}$, respectively.

Thus, according to the first stage 400, the capacitor 338 may store an offset voltage. The offset voltage may be approximately equal to the difference between the left branch voltage (e.g., the first voltage output (OUT_SC1) and the right branch voltage (e.g., the second voltage output (OUT_SC2). The offset voltage may be based on transistor mismatches (e.g., transistor threshold voltage mismatches) between transistors at the left branch and transistors at the right branch. Storing the left branch voltage ($V_{ref\_L}$) and the right branch voltage ($V_{ref\_R}$) at the capacitor 338 may enable the offset voltage between the left branch and the right branch to be substantially "canceled" out, as described below.

Figure 5:
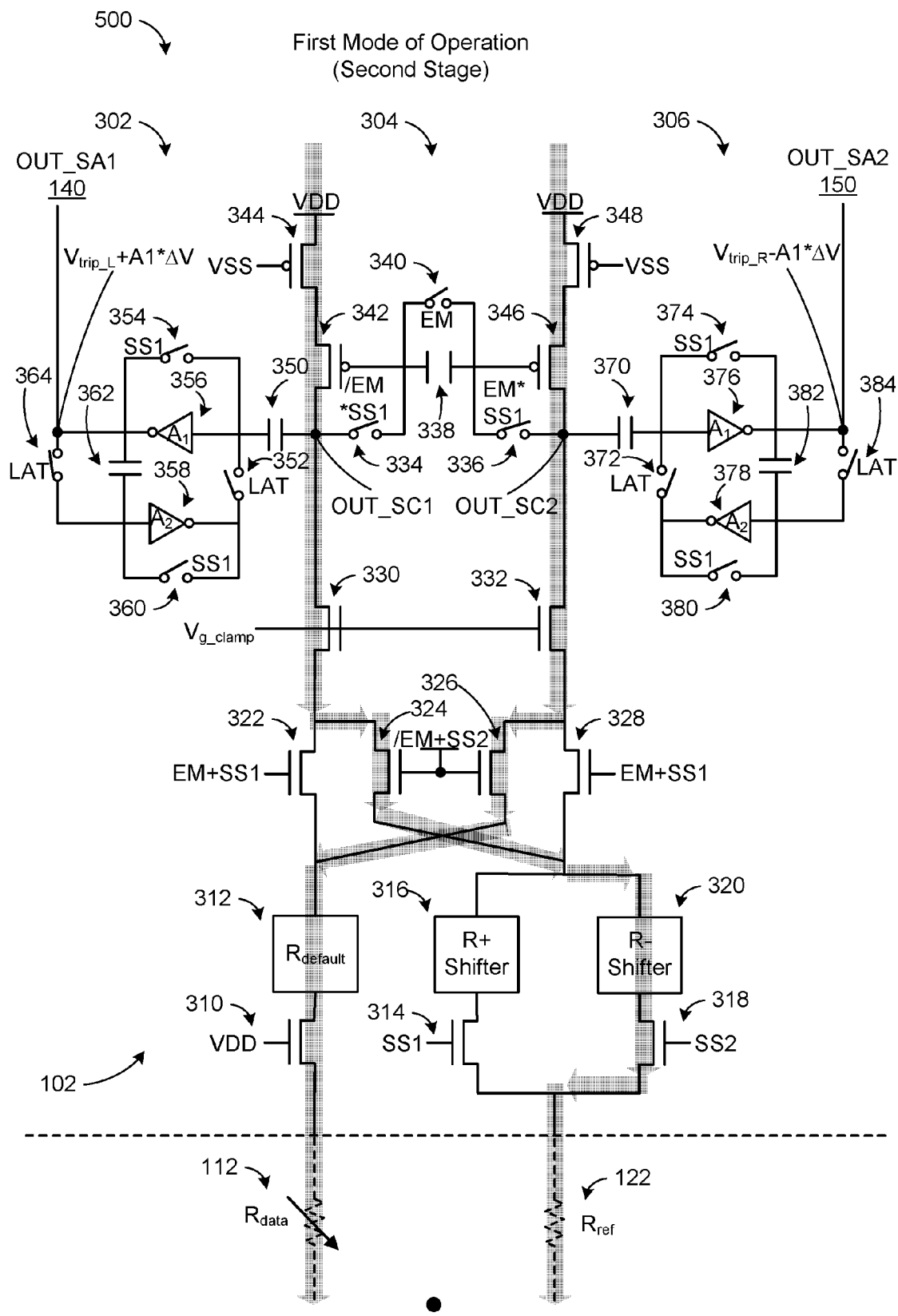
FIG. 5 illustrates a second stage of sensing the data value of the memory cell according to the first mode of operation.

Referring to FIG. 5, a second stage 500 of sensing the data value of the data cell 110 according to the first mode of operation is shown. According to the second stage 500, the signal (SS1) and the signal (EM+SS1) are set to logical low voltage levels to deactivate the transistors 314, 322, 328. The signal (SS2) and the signal (/EM+SS2) are set to logical high voltage levels to activate the transistors 318, 324, 326. As a result, the MTJ element 112 is connected to a right branch of the DMSS circuit 102 (as illustrated by the shaded arrow), and the reference resistor 122 is connected to a left branch of the DMSS circuit 102 (as illustrated by the shaded arrow).

A first voltage output (OUT_SC1) of the offset-canceling sensing circuit 304 may be approximately equal to the sum of the voltages across the clamp transistor 330, the transistor 324, the second resistive shift element 320, the transistor 318, the reference resistor 122, and the access transistor 124. Thus, the first voltage output (OUT_SC1) of the offset-canceling circuit 304 during the second stage 500 may be change from $V_{ref\_L}$ to $V_{ref\_L}$+ΔV, where ΔV is positive if $R_{data}$ has a low resistance value, and where ΔV is negative if $R_{data}$ has a high resistance value. A second voltage output (OUT_SC2) of the offset-canceling sensing circuit 304 may be approximately equal to the sum of the voltages across the clamp transistor 332, the transistor 326, the default resistive element 312, the transistor 310, the MTJ element 112, and the access transistor 114. Thus, the second voltage output (OUT_SC2) of the offset-canceling circuit 304 during the second stage 500 may be changed from $V_{ref\_R}$ to $V_{ref\_R}$-ΔV.

Because of the capacitive coupling of the isolation capacitors 350, 370, ΔV may be provided (e.g., transferred) to the input of the inverters 356, 376. Each inverter may have a similar gain (A1). Thus, during the second stage 500, the first sensed output (OUT_SA1) 140 may be approximately equal to $V_{trip\_L}$+A1*ΔV. As used herein, $V_{trip}$ may be approximately equal to the average of the supply voltage (VDD) and the ground voltage. However, it should be noted that due to process variations, the voltage level of $V_{trip}$ may vary. $V_{trip}$ may be set during the first stage 400. Additionally, the second sensed output (OUT_SA2) 150 may be approximately equal to $V_{trip\_R}$-A1*ΔV.

Thus, according to the second stage 500, the capacitive coupling of the isolation capacitors 350, 370 may provide the ΔV to the inverters such that the first sensed output (OUT_SA1) 140 is approximately equal to $V_{trip\_L}$+A1*ΔV and the second sensed output (OUT_SA2) 150 is approximately equal to $V_{trip\_R}$-A1*ΔV.

Figure 6:
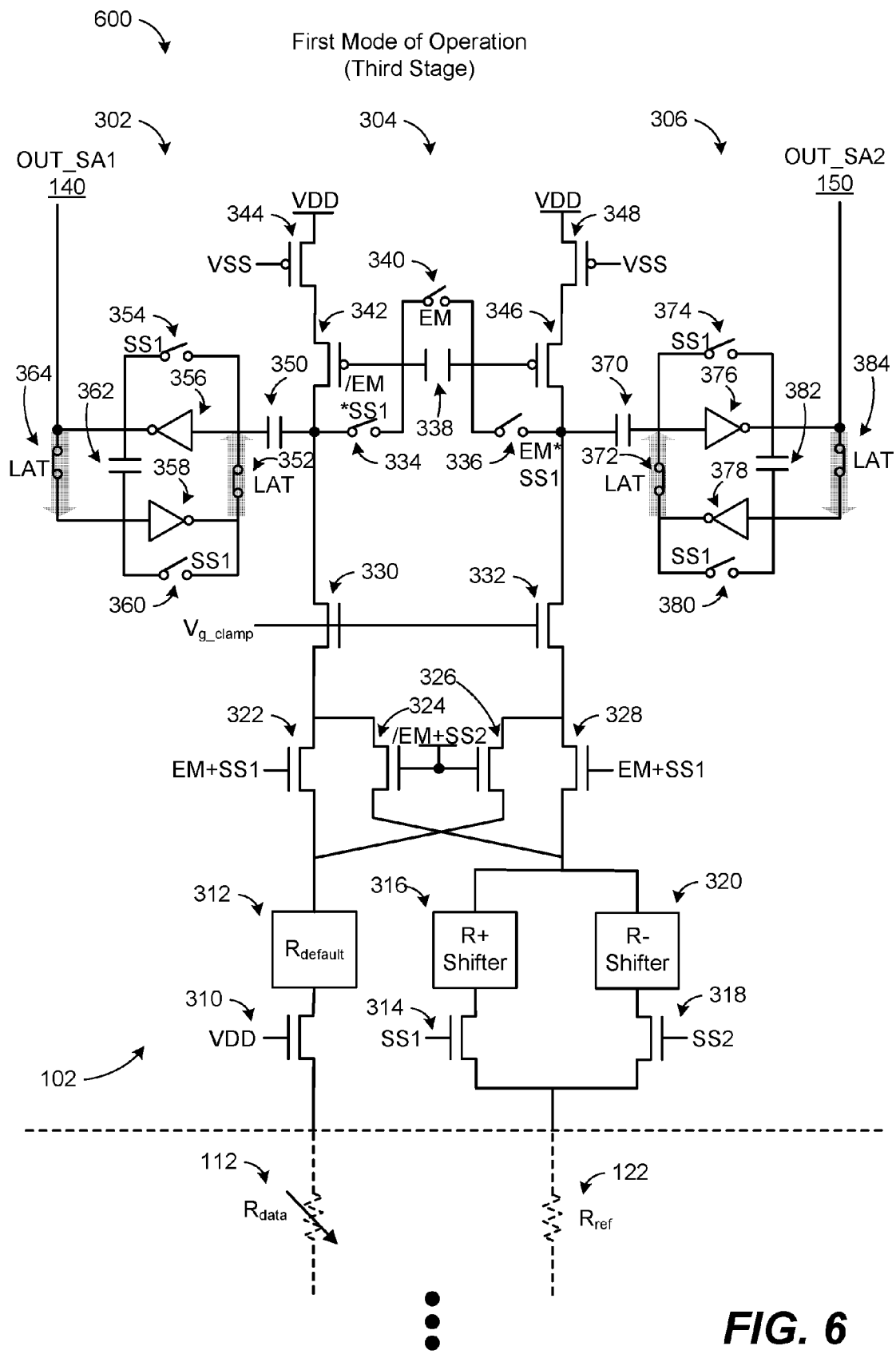
FIG. 6 illustrates a third stage of sensing the data value of the memory cell according to the first mode of operation.

Referring to FIG. 6, a third stage 600 of sensing the data value of the data cell 110 according to the first mode of operation is shown. According to the third stage 600, switches 352, 364, 372, 384 are activated (e.g., closed). The first sensed output (OUT_SA1) 140 becomes either the supply voltage (VDD) or ground, and the first sensed output 140 and is latched at the first offset-canceling sense amplifier 302. Additionally, the second sensed output (OUT_SA2) 150 either the supply voltage (VDD) or ground, and the second sensed output 150 is latched at the second offset-canceling sense amplifier 306.

As described with respect to FIG. 1, if the first sensed output (OUT_SA1) 140 is different from the second sensed output (OUT_SA2) 150, the sensing operation is complete and the first sensed output (OUT_SA1) 140 is used to determine the data value of the data cell 110. However, if the first sensed output (OUT_SA1) 140 is similar to the second sensed output (OUT_SA2) 150, the DMSS circuit 102 senses the data value of the data cell 110 according to the second mode of operation, as described in greater detail with respect to FIGS. 7-11.

The signal (SS1) and the signal (EM+SS1) are set to logical low voltage levels to deactivate the transistors 314, 322, 328. The signal (SS2) and the signal (/EM+SS2) are set to logical high voltage levels to activate the transistors 318, 324, 326. As a result, the MTJ element 112 is connected to a right branch of the DMSS circuit 102 (as illustrated by the shaded arrow), and the reference resistor 122 is connected to a left branch of the DMSS circuit 102 (as illustrated by the shaded arrow).

Figure 7:
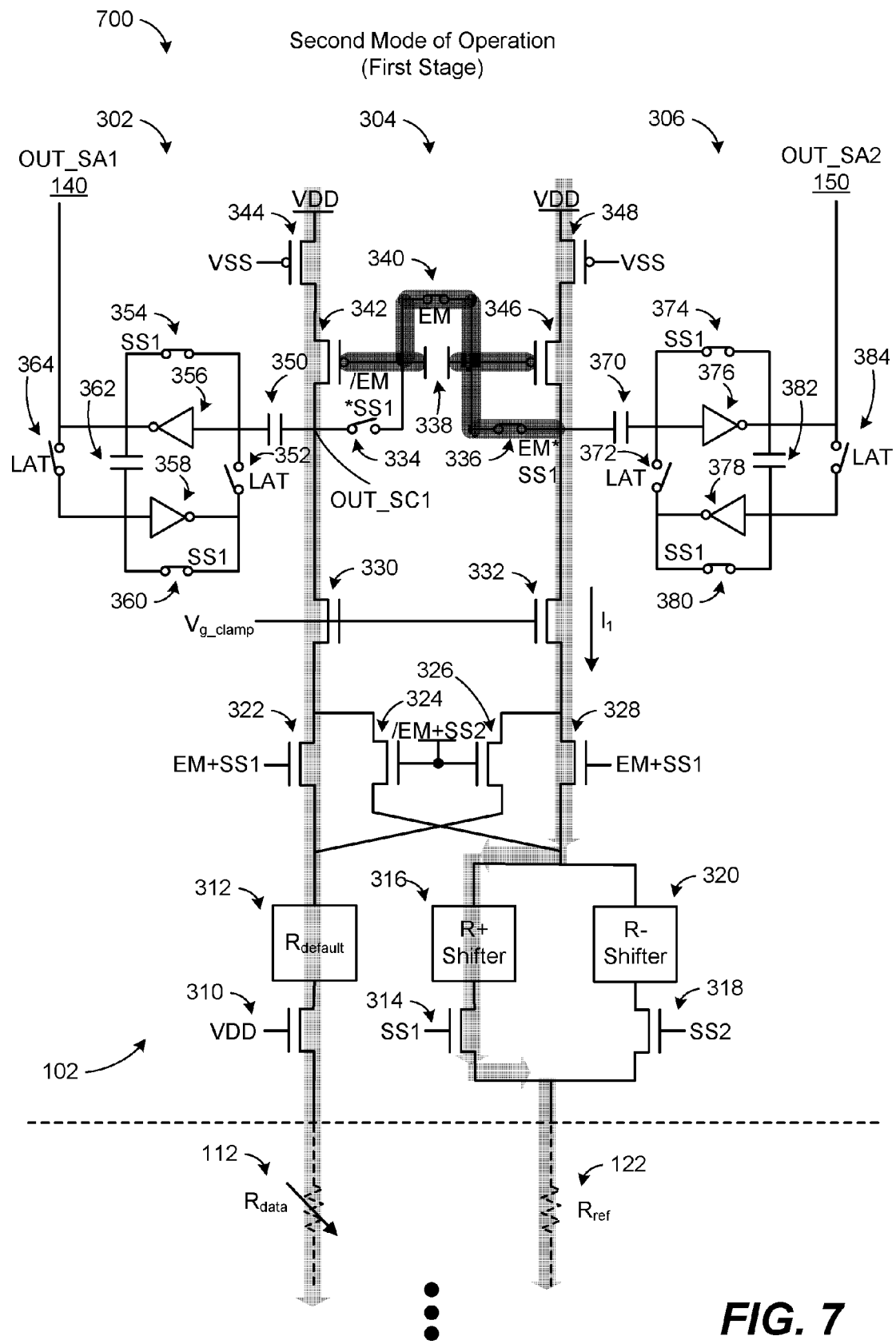
FIG. 7 illustrates a first stage of sensing the data value of the memory cell according to a second mode of operation.

Referring to FIG. 7, a first stage 700 of sensing the data value of the data cell 110 according to the second mode of operation is shown. According to the first stage 700, the signal (SS1) is set to a logical high voltage level to activate the transistor 314. Additionally, the switches 354, 360, 374, 380 are activated based on the signal (SS1). The signal (EM+SS1) is set to a logical high voltage level to activate the transistors 322, 328. The signal (SS2) and the signal (EM+SS2) are set to logical low voltage levels to deactivate the transistors 318, 324, 326. As a result, the MTJ element 112 is connected to a left branch of the DMSS circuit 102 (as illustrated by the leftward shaded arrow), and the reference resistor 122 is connected to a right branch of the DMSS circuit 102 (as illustrated by the rightward shaded arrow).

During operation of the first stage 700, a first current ($I_1$) may propagate through the right branch. Because the switch 340 is activated, the transistors 342, 346 may operate as a "current mirror" circuit and the first current ($I_1$) may also propagate through the left branch. A first voltage output (OUT_SC1) of the offset-canceling sensing circuit 304 may be approximately equal to the sum of the voltages across the clamp transistor 330, the transistor 322, the default resistive element 312, the transistor 310, the MTJ element 112, and the access transistor 114. According to the first stage 700, the first voltage output (OUT_SC1) may also be referred to as the "left branch" voltage ($V_{ref\_L}$). A second voltage output (OUT_SC2) of the offset-canceling sensing circuit 304 may be approximately equal to the sum of the voltages across the clamp transistor 332, the transistor 328, the first resistive shift element 316, the transistor 314, the reference resistor 122, and the access transistor 124. The switches 336, 340 may be activated and the first voltage output (OUT_SC1) may be stored at the capacitor 350.

Figure 8:
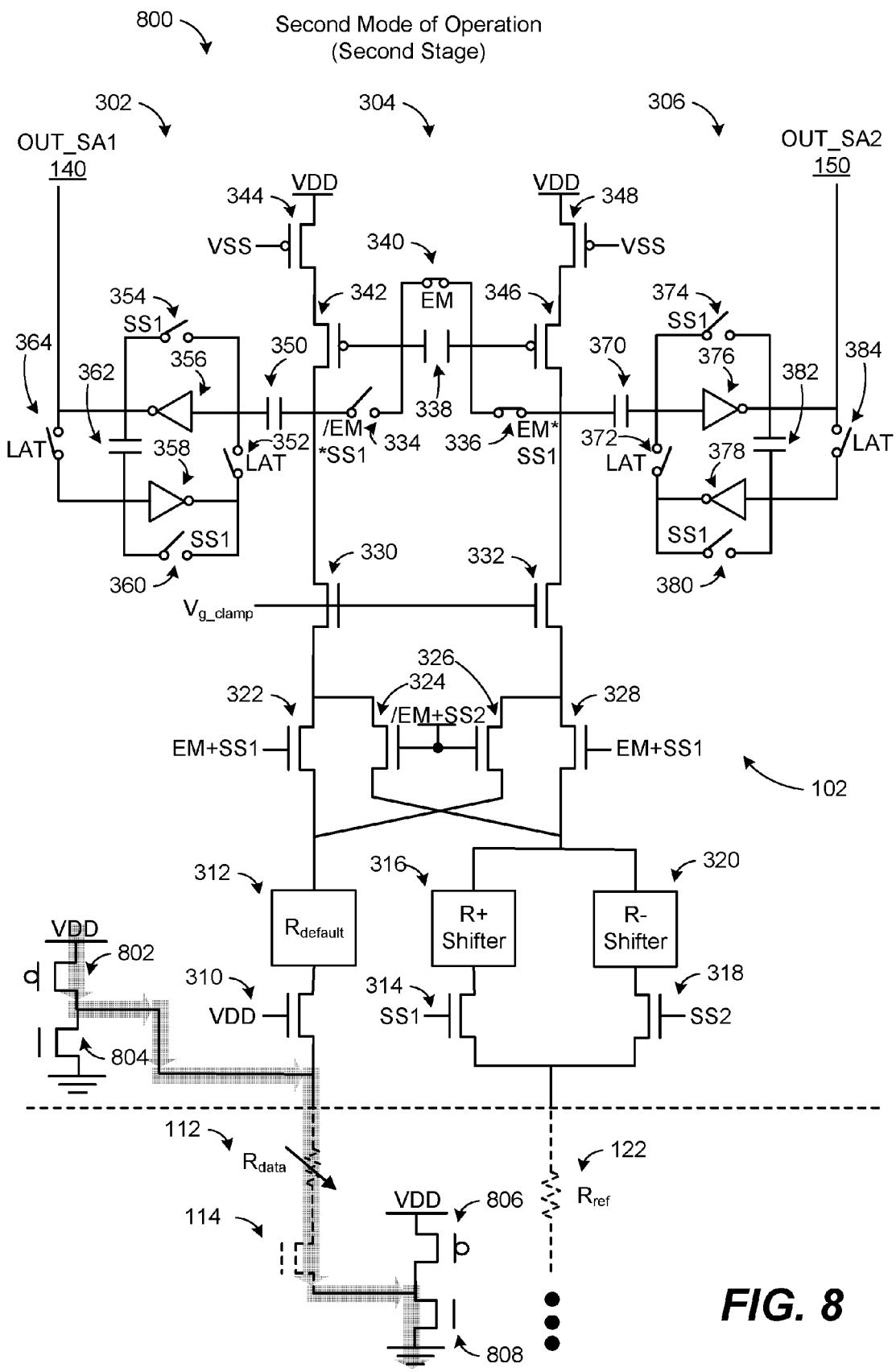
FIG. 8 illustrates a second stage of sensing the data value of the memory cell according to the third mode of operation.

Referring to FIG. 8, a second stage 800 of sensing the data value of the data cell 110 according to the second mode of operation is shown. According to the second stage 800, a write driver is used to write the data cell resistance ($R_{data}$) to a low resistance ($R_L$) value.

The write driver includes a transistor 802, a transistor 804, a transistor 806, and a transistor 808. According to one implementation, the transistors 802, 806 are PMOS transistors, and the transistors 804, 808 are NMOS transistors. A source of the transistor 802 is coupled to the supply voltage (VDD), and a drain of the transistor 802 is coupled to a source of the transistor 310. A source of the transistor 804 is coupled to ground, and a drain of the transistor 804 is coupled to a drain of the transistor 802. A source of the transistor 806 is coupled to the supply voltage (VDD), and a drain of the transistor 806 is coupled to a source of the access transistor 114. A source of the transistor 808 is coupled to ground, and a drain of the transistor 808 is coupled to a drain of the transistor 806.

To write the low resistance ($R_L$) value to the data cell resistance ($R_{data}$), a write current ($I_{write0}$) propagates from the supply voltage (VDD) through the transistor 802, the MTJ element 112, the access transistor 114, the transistor 808, and to ground. The write current ($I_{write0}$) is illustrated by the shaded arrow.

Figure 9:
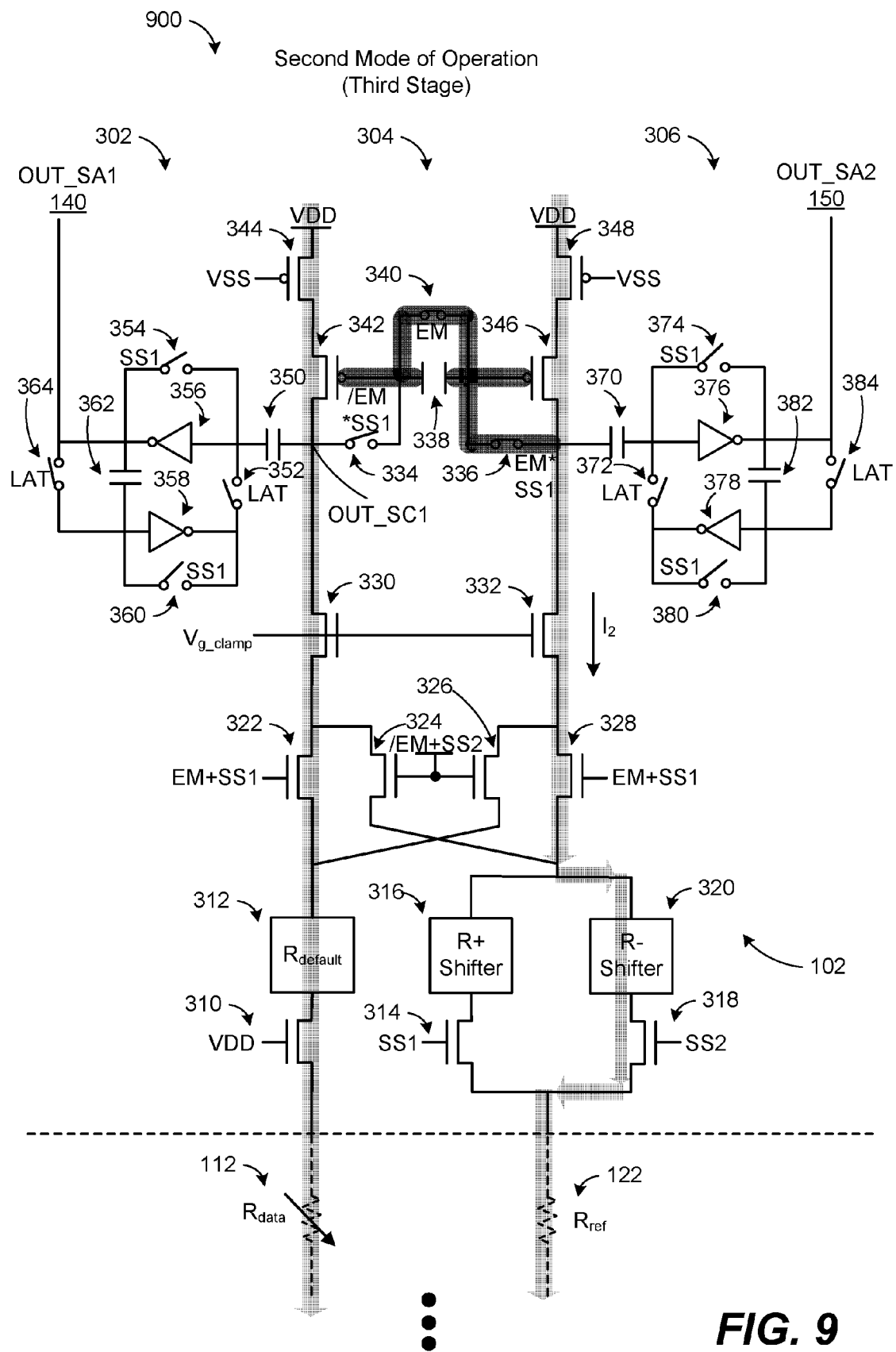
FIG. 9 illustrates a third stage of sensing the data value of the memory cell according to the third mode of operation.

Referring to FIG. 9, a third stage 900 of sensing the data value of the data cell 110 according to the second mode of operation is shown. According to the third stage 900, the signal (SS1) and the signal (/EM+SS2) are set to a logical low voltage level to deactivate the transistors 314, 324, 326. Additionally, the signal (SS2) and the signal (EM+SS1) are set to a logical high voltage level to activate the transistors 318, 322, 328. As a result, the MTJ element 112 is connected to a left branch of the DMSS circuit 102 (as illustrated by the leftward shaded arrow), and the reference resistor 122 is connected to a right branch of the DMSS circuit 102 (as illustrated by the rightward shaded arrow).

During operation of the third stage 900, a second current ($I_2$) may propagate through the right branch. Because the switch 340 is activated, the transistors 342, 346 may operate as a "current mirror" circuit and the second current ($I_2$) may also propagate through the left branch. A first voltage output (OUT_SC1) of the offset-canceling sensing circuit 304 may be approximately equal to the sum of the voltages across the clamp transistor 330, the transistor 322, the default resistive element 312, the transistor 310, the MTJ element 112, and the access transistor 114. Thus, the first voltage output (OUT_SC1) of the offset-canceling circuit 304 during the third stage 900 may be change from $V_{ref\_L}$ to $V_{ref\_L}+\Delta V$, where $\Delta V$ is positive if $R_{data}$ has a low resistance value, and where $\Delta V$ is negative if $R_{data}$ has a high resistance value. Because the signal (SS2) is activated, the second resistive element 320 is connected to the right branch of the DMSS circuit 102, and a current propagates along the right branch of the DMSS circuit that is greater than the current during the first stage 700. The second current ($I_2$) may be larger than the first current ($I_1$). For example, because the second resistive element 320 is coupled to the right branch (as opposed to the first resistive element 316 as illustrated in the first stage 700) and the low resistance ($R_L$) value is written to the data cell resistance ($R_{data}$), total resistance of both branches may be smaller than the resistances at the first stage 700. The smaller resistances may result in a larger second current ($I_2$).

Figure 10:
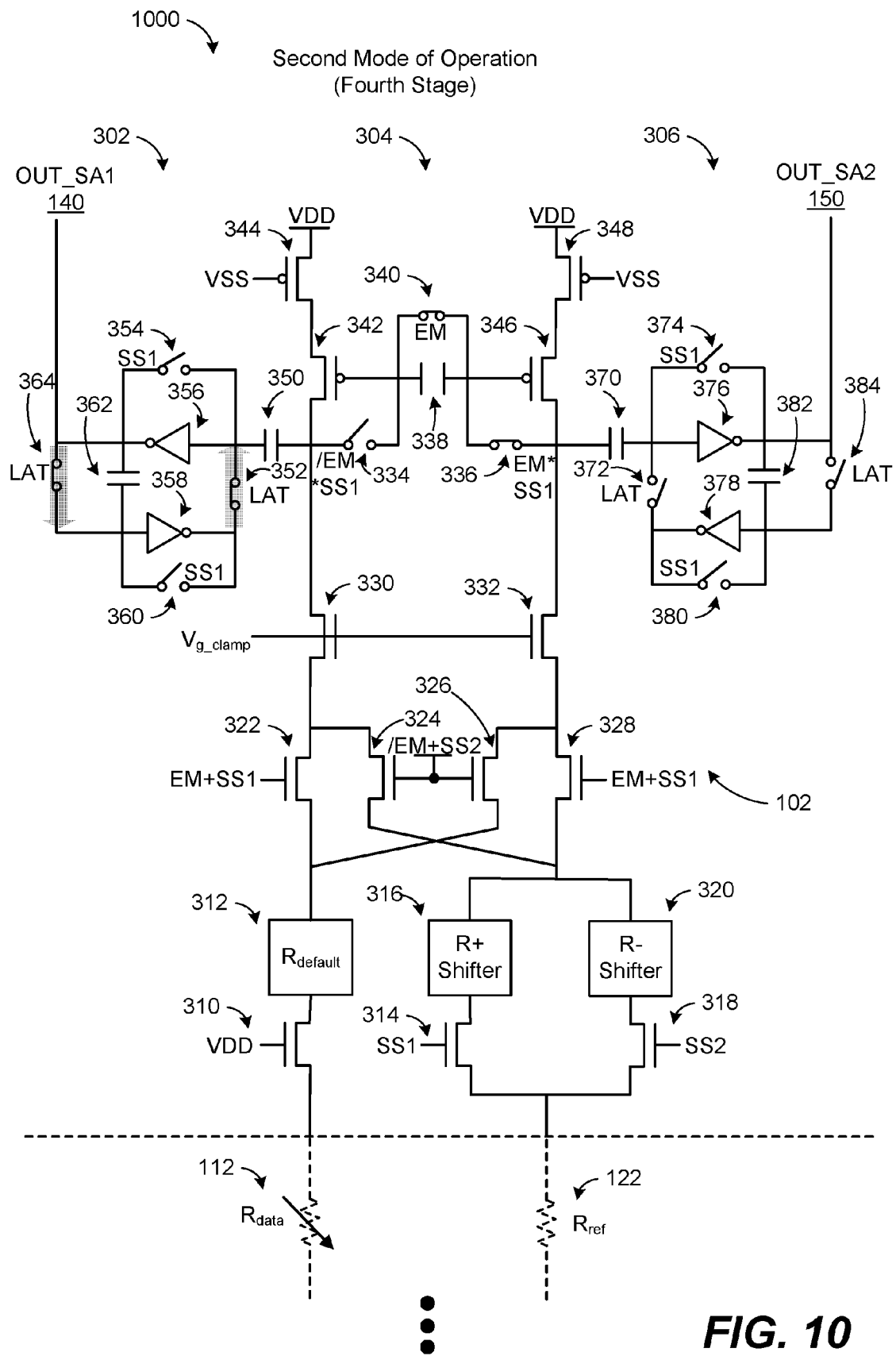
FIG. 10 illustrates a fourth stage of sensing the data value of the memory cell according to the third mode of operation.

Referring to FIG. 10, a fourth stage 1000 of sensing the data value of the data cell 110 according to the second mode of operation is shown. According to the fourth stage 1000, switches 352, 364, 372, 384 are activated (e.g., closed). The first sensed output (OUT_SA1) 140 may be approximately equal to either the supply voltage (VDD) or ground, and the first sensed output 140 is latched at the first offset-canceling sense amplifier 302.

Figure 11:
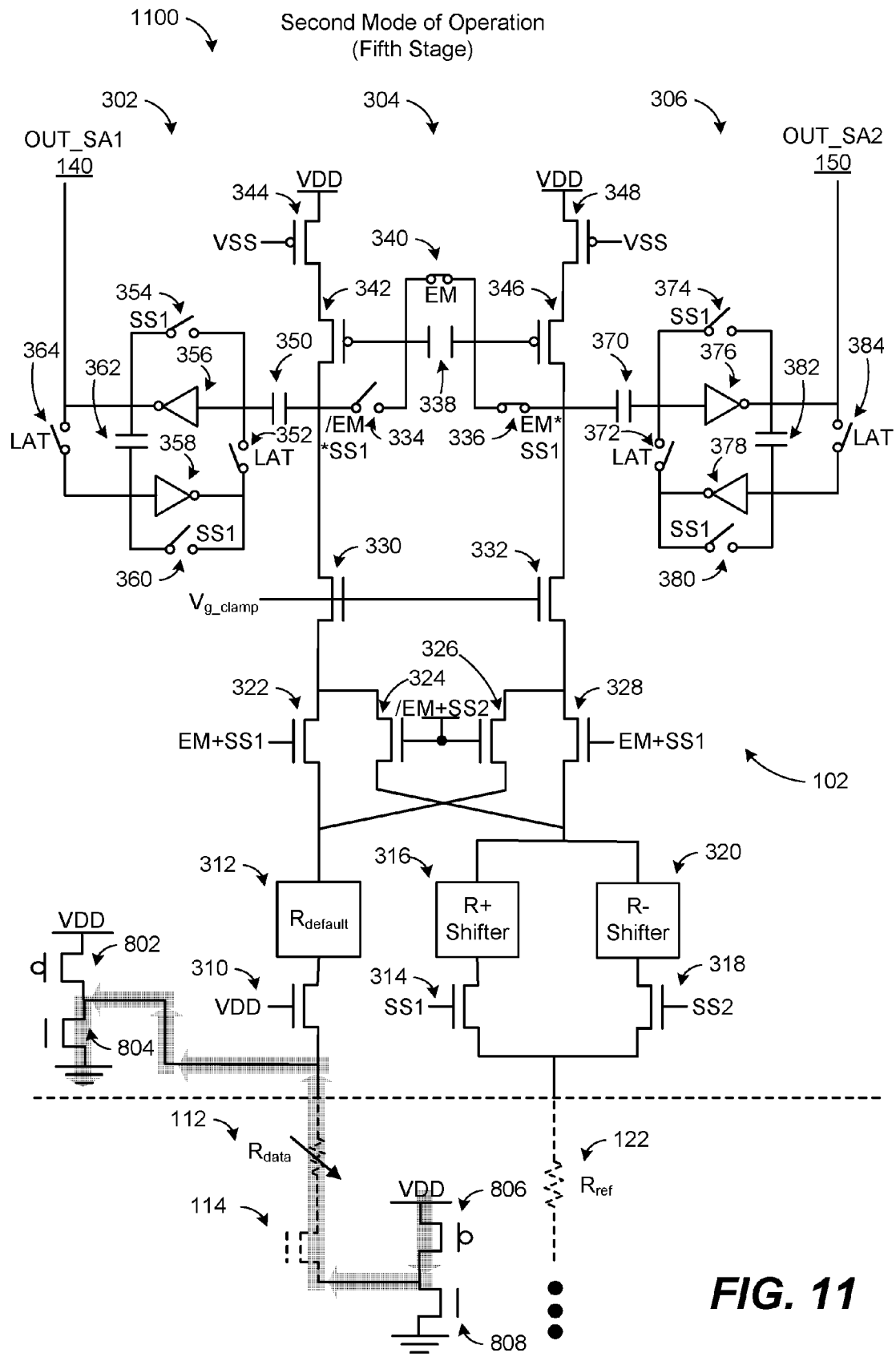
FIG. 11 illustrates a fifth stage of sensing the data value of the memory cell according to the third mode of operation.

Referring to FIG. 11, a fifth stage 1100 of sensing the data value of the data cell 110 according to the second mode of operation is shown. According to the fifth stage 1100, the write driver is used to write the data cell resistance ($R_{data}$) back to a high resistance ($R_H$) value if the original data cell resistance ($R_{data}$) was high (e.g., if the first sensed output (OUT_SA1) 140 has a logical high voltage level). Otherwise, if the first sensed output (OUT_SA1) 140 has a logical low voltage level, the fifth stage 1100 may be bypassed and sensing operations are complete.

To write the data cell resistance ($R_{data}$) to the high resistance ($R_H$) value, a write current ($I_{write1}$) propagates from the supply voltage (VDD) through the transistor 806, the access transistor 114, the MTJ element 112, the transistor 804, and to ground. The write current ($I_{write1}$) is illustrated by the shaded arrow.

The techniques described with respect to FIGS. 4-11 may reduce the relatively long sensing times and energy consumption associated with the second mode of operation (e.g., FIGS. 7-11) by only sensing the data cell 110 according to the second mode of operation when the data value of the first sensed output 140 is the same as a data value of the second sensed output 150. Otherwise, the data cell 110 may be sensed according to the first mode of operation (e.g., FIGS. 4-6). The first mode of operation is a faster mode of operation that requires less energy consumption than the second mode of operation.

Thus, by operating in the first mode (e.g., the "normal" mode) and the second mode (e.g., the "exception" mode), reduced performance and energy overheads may be achieved along with an improved read yield ($RAPY_{CELL}$). However, even if the perform and energy overheads are significant in the exception mode, the overall performance and energy overheads may be reduced because the probability of exception mode occurrence is relatively small, as described with respect to FIG. 2.

Figure 12:
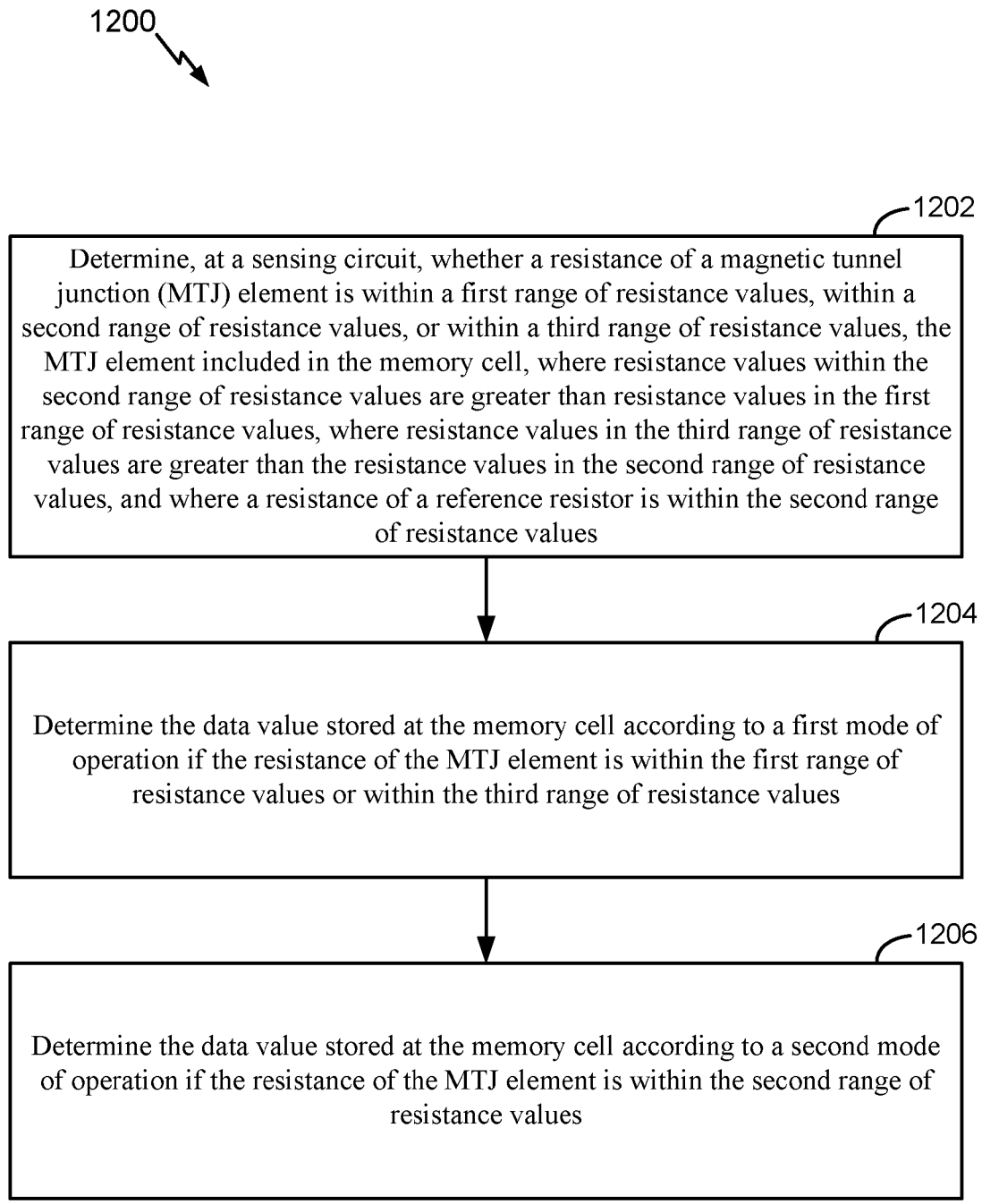
FIG. 12 is a flowchart of a method for sensing a data value of a memory cell according to a dual mode sensing scheme.

Referring to FIG. 12, a flowchart of a method 1200 for sensing a data value of a memory cell according to a dual mode sensing scheme is shown. The method may be performed using the techniques described with respect to FIGS. 1-11.

The method 1200 includes determining, at a sensing circuit, whether a resistance of a MTJ element is within a first range of resistance values, within a second range of resistance values, or within a third range of resistance values, at 1202. The MTJ element may be included in a memory cell. Resistance values within the second range of resistance values may be greater than resistance values in the first range of resistance values, and resistance values in the third range of resistance values may be greater than the resistance values in the second range of resistance values. A resistance of a reference resistor may be within the second range of resistance values.

For example, referring to FIGS. 1-2, the DMSS circuit 102 may determine whether the data cell resistance ($R_{data}$) of the MTJ element 112 is within the first range of resistance values 202, within the second range of resistance values 204, or within the third range of resistance values 206. To determine the range of resistance values that the data cell resistance ($R_{data}$) is within, the DMSS circuit 102 may generate the first sensed output (OUT_SA1) 140 and the second sensed output (OUT_SA2) 150. The first sensed output 140 may be provided to a first terminal of the exclusive NOR logic gate 130, and the second sensed output 150 may be provided to a second terminal of the exclusive NOR logic gate 130. If the first sensed output 140 is different from the second sensed output 150, the DMSS circuit 102 may determine that the data cell resistance ($R_{data}$) is within the first or third range of resistance values 202, 206. If the first sensed output 140 is the same as the second sensed output 150, the DMSS circuit 102 may determine that the data cell resistance ($R_{data}$) is within the second range or resistance values 204.

According to one implementation, the method 1200 includes generating a first sensed output at a first sense amplifier of the sensing circuit and generating a second sensed output at a second sense amplifier of the sensing circuit. For example, referring to FIGS. 1-2, the first offset-canceling sense amplifier 302 may generate the first sensed output 140, and the second offset-canceling sense amplifier 306 may generate the second sensed output 150. The method 1200 may also include determining whether the first sensed output is different from than the second sensed output. The resistance ($R_{data}$) of the MTJ element 112 may be within the first range of resistance values 202 or within the third range of resistance values 206 if the first sensed output 140 is different than the second sensed output 150. The resistance ($R_{data}$) of the MTJ element 112 may be within the second range of resistance values 204 if the first sensed output 140 is similar to the second sensed output 150.

A data value of the memory cell may be determined according to a first mode of operation if the resistance of the MTJ element is within the first range of resistance values or within the third range of resistance values, at 1204. The techniques for determining the data value stored at the memory cell according to the first mode of operation are described in greater detail with respect to FIGS. 4-6.

The data value of the memory cell may be determined according to a second mode of operation if the resistance of the MTJ element is within the second range of resistance values, at 1206. According to one implementation, the second mode of operation corresponds to a data-cell-variation-tolerant sensing scheme. Determining the data value stored at the memory cell according to the second mode of operation includes storing the first output voltage (OUT_SC1) of the sensing circuit at the capacitor 350 and changing the resistance ($R_{data}$) of the MTJ element 112 to a low resistance level ($R_L$). For example, changing the resistance ($R_{data}$) of the MTJ element 112 to the low resistance level ($R_L$) may include applying the first write current ($I_{write0}$) to the MTJ element 112 using the write driver.

Determining the data value stored at the memory cell according to the second mode of operation also includes sensing an adjusted first output voltage that is based at least in part on the low resistance level ($R_L$) of the MTJ element 112. Determining the data value stored at the memory cell according to the second mode of operation further includes latching the first sensed output 140 at the first sense amplifier (e.g., the first offset-canceling sense amplifier 302) and determining the data value stored at the memory cell based on the first sensed output 140. The first sensed output 140 may be based on the first output voltage (OUT_SC1) and the adjusted first output voltage. The techniques for determining the data value stored at the memory cell according to the second mode of operation are described in greater detail with respect to FIGS. 7-11.

The data value stored at the memory cell may correspond to a logical one data value if the first sensed output 140 has a logical high voltage level. The data value stored at the memory cell may correspond to a logical zero data value if the first sensed output 140 has a logical low voltage level. According to one implementation, the method 1200 includes changing the resistance ($R_{data}$) of the MTJ element 112 to a high resistance level ($R_H$) if the first sensed output 140 has a logical high voltage level. For example, changing the resistance ($R_{data}$) of the MTJ element 112 to the high resistance level ($R_H$) may include applying the second write current ($I_{write1}$) to the MTJ element 112 using the write driver.

The method 1200 of FIG. 12 may reduce the relatively long sensing times and energy consumption associated with the second mode of operation (e.g., FIGS. 7-11) by only sensing the data cell 110 according to the second mode of operation when the data value of the first sensed output 140 is the same as a data value of the second sensed output 150. Otherwise, the data cell 110 may be sensed according to the first mode of operation (e.g., FIGS. 4-6). The first mode of operation is a faster mode of operation that requires less energy consumption than the second mode of operation. Thus, by operating in the first mode (e.g., the "normal" mode) and the second mode (e.g., the "exception" mode), reduced performance and energy overheads may be achieved along with an improved read yield ($RAPY_{CELL}$). However, even if the perform and energy overheads are significant in the exception mode, the overall performance and energy overheads may be reduced because the probability of exception mode occurrence is relatively small, as described with respect to FIG. 2.

Referring to FIG. 13, a block diagram of a device 1300 including components operable to sense a data value of a memory cell according to a dual mode sensing scheme is shown. The device 1300 includes a processor 1310, such as a digital signal processor (DSP), coupled to a memory 1332. The device 1300 also includes a memory device 1390 that is coupled to the processor 1310. The memory device 1390 includes the system 100 of FIG. 1.

FIG. 13 also shows a display controller 1326 that is coupled to the processor 1310 and to a display 1328. A coder/decoder (CODEC) 1334 can also be coupled to the processor 1310. A speaker 1336 and a microphone 1338 can be coupled to the CODEC 1334. FIG. 13 also indicates that a wireless controller 1340 can be coupled to the processor 1310 and to an antenna 1342. A radio frequency (RF) interface 1380 may be disposed between the wireless controller 1340 and the antenna 1342.

The memory 1332 may be a tangible non-transitory processor-readable storage medium that includes executable instructions 1356. The instructions 1356 may be executed by a processor, such as the processor 1310 to perform the method 1200 of FIG. 12. In a particular implementation, the processor 1310, the display controller 1326, the memory 1332, the CODEC 1334, and the wireless controller 1340 are included in a system-in-package or system-on-chip device 1322. In a particular implementation, an input device 1330 and a power supply 1344 are coupled to the system-on-chip device 1322. Moreover, in a particular implementation, as illustrated in FIG. 13, the display 1328, the input device 1330, the speaker 1336, the microphone 1338, the antenna 1342, and the power supply 1344 are external to the system-on-chip device 1322. However, each of the display 1328, the input device 1330, the speaker 1336, the microphone 1338, the antenna 1342, and the power supply 1344 can be coupled to a component of the system-on-chip device 1322, such as an interface or a controller.

In conjunction with the described implementations, an apparatus includes means for determining whether a resistance of a magnetic tunnel junction (MTJ) element is within a first range of resistance values, within a second range of resistance values, or within a third range of resistance values. The MTJ element may be included in a memory cell. Resistance values within the second range of resistance values may be greater than resistance values within the first range of resistance values, and resistance values within the third range of resistance values may be greater than the resistance values with the second range of resistance values. A resistance of a reference resistor is within the second range of resistance values. For example, the means for determining may include the DMSS circuit 102 of FIGS. 1 and 3-11, the system 100 of FIGS. 1 and 13, the processor 1310 that is operable to execute the instructions 1356 of FIG. 13, one or more other devices, circuits, modules, or any combination thereof.

The apparatus may also include means for determining the data value stored at the memory cell according to a first mode of operation if the resistance of the MTJ element is within the first range of resistance values or within the third range of resistance values. For example, the means for determining the data value stored at the memory cell according to the first mode of operation may include the DMSS circuit 102 of FIGS. 1 and 3-11, the system 100 of FIGS. 1 and 13, the processor 1310 that is operable to execute the instructions 1356 of FIG. 13, one or more other devices, circuits, modules, or any combination thereof.

The apparatus may also include means for determining the data value stored at the memory cell according to a second mode of operation if the resistance of the MTJ element is within the second range of resistance values. For example, the means for determining the data value stored at the memory cell according to the second mode of operation may include the DMSS circuit 102 of FIGS. 1 and 3-11, the system 100 of FIGS. 1 and 13, the processor 1310 that is operable to execute the instructions 1356 of FIG. 13, one or more other devices, circuits, modules, or any combination thereof.

The foregoing disclosed devices and functionalities may be designed and configured into computer files (e.g., RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in devices described above. FIG. 14 depicts a particular illustrative implementation of an electronic device manufacturing process 1400.

Physical device information 1402 is received at the manufacturing process 1400, such as at a research computer 1406. The physical device information 1402 may include design information representing at least one physical property of the system 100 of FIG. 1 or at least one of the components thereof, such as a physical property of a device described with reference to FIGS. 1-11. For example, the physical device information 1402 may include physical parameters, material characteristics, and structure information that is entered via a user interface 1404 coupled to the research computer 1406. The research computer 1406 includes a processor 1408, such as one or more processing cores, coupled to a computer-readable medium such as a memory 1410. The memory 1410 may store computer-readable instructions that are executable to cause the processor 1408 to transform the physical device information 1402 to comply with a file format and to generate a library file 1412.

In a particular implementation, the library file 1412 includes at least one data file including the transformed design information. For example, the library file 1412 may include the system 100 of FIG. 1 or at least one of the components thereof, provided for use with an electronic design automation (EDA) tool 1420.

The library file 1412 may be used in conjunction with the EDA tool 1420 at a design computer 1414 including a processor 1416, such as one or more processing cores, coupled to a memory 1418. The EDA tool 1420 may be stored as processor executable instructions at the memory 1418 to enable a user of the design computer 1414 to design the system 100 of FIG. 1 or at least one of the components thereof, using the library file 1412. For example, a user of the design computer 1414 may enter circuit design information 1422 via a user interface 1424 coupled to the design computer 1414. The circuit design information 1422 may include design information representing at least one physical property of the system 100 of FIG. 1 or at least one of the components thereof. To illustrate, the circuit design property may include identification of particular circuits and relationships to other elements in a circuit design, positioning information, feature size information, interconnection information, or other information representing a physical property of an electronic device.

The design computer 1414 may be configured to transform the design information, including the circuit design information 1422, to comply with a file format. To illustrate, the file formation may include a database binary file format representing planar geometric shapes, text labels, and other information about a circuit layout in a hierarchical format, such as a Graphic Data System (GDSII) file format. The design computer 1414 may be configured to generate a data file including the transformed design information, such as a GDSII file 1426 that includes information describing the system 100 of FIG. 1 or at least one of the components thereof, in addition to other circuits or information. To illustrate, the data file may include information corresponding to a system-on-chip (SOC) or a chip interposer component that includes the system 100 of FIG. 1 or at least one of the components thereof, and that also includes additional electronic circuits and components within the SOC.

The GDSII file 1426 may be received at a fabrication process 1428 to manufacture the system 100 of FIG. 1 or at least one of the components thereof according to transformed information in the GDSII file 1426. For example, a device manufacture process may include providing the GDSII file 1426 to a mask manufacturer 1430 to create one or more masks, such as masks to be used with photolithography processing, illustrated in FIG. 14 as a representative mask 1432. The mask 1432 may be used during the fabrication process to generate one or more wafers 1433, which may be tested and separated into dies, such as a representative die 1436. The die 1436 includes the system 100 of FIG. 1 or at least one of the components thereof.

In a particular implementation, the fabrication process 1428 may be initiated by or controlled by a processor 1434. The processor 1434 may access a memory 1435 that includes executable instructions such as computer-readable instructions or processor-readable instructions. The executable instructions may include one or more instructions that are executable by a computer, such as the processor 1434.

The fabrication process 1428 may be implemented by a fabrication system that is fully automated or partially automated. For example, the fabrication process 1428 may be automated and may perform processing steps according to a schedule. The fabrication system may include fabrication equipment (e.g., processing tools) to perform one or more operations to form an electronic device. For example, the fabrication equipment may be configured to perform one or more of the processes described with reference to FIGS. 1-11 using integrated circuit manufacturing processes (e.g., wet etching, chemical vapor etching, dry etching, deposition, chemical vapor deposition, planarization, lithography, in-situ baking, or a combination thereof).

The fabrication system may have a distributed architecture (e.g., a hierarchy). For example, the fabrication system may include one or more processors, such as the processor 1434, one or more memories, such as the memory 1435, and/or controllers that are distributed according to the distributed architecture. The distributed architecture may include a high-level processor that controls or initiates operations of one or more low-level systems. For example, a high-level portion of the fabrication process 1428 may include one or more processors, such as the processor 1434, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular implementation, the fabrication system may include multiple processors that are distributed in the fabrication system. For example, a controller of a low-level system component of the fabrication system may include a processor, such as the processor 1434.

Alternatively, the processor 1434 may be a part of a high-level system, subsystem, or component of the fabrication system. In another implementation, the processor 1434 includes distributed processing at various levels and components of a fabrication system.

The die 1436 may be provided to a packaging process 1438 where the die 1436 is incorporated into a representative package 1440. For example, the package 1440 may include the single die 1436 or multiple dies, such as a system-in-package (SiP) arrangement. The package 1440 may be configured to conform to one or more standards or specifications, such as Joint Electron Device Engineering Council (JEDEC) standards.

Information regarding the package 1440 may be distributed to various product designers, such as via a component library stored at a computer 1446. The computer 1446 may include a processor 1448, such as one or more processing cores, coupled to a memory 1450. A printed circuit board (PCB) tool may be stored as processor executable instructions at the memory 1450 to process PCB design information 1442 received from a user of the computer 1446 via a user interface 1444. The PCB design information 1442 may include physical positioning information of a packaged electronic device on a circuit board, the packaged electronic device corresponding to the package 1440 including the system 100 of FIG. 1 or at least one of the components thereof.

The computer 1446 may be configured to transform the PCB design information 1442 to generate a data file, such as a GERBER file 1452 with data that includes physical positioning information of a packaged electronic device on a circuit board, as well as layout of electrical connections such as traces and vias, where the packaged electronic device corresponds to the package 1440 including the system 100 of FIG. 1 or at least one of the components thereof. In other implementations, the data file generated by the transformed PCB design information may have a format other than a GERBER format.

The GERBER file 1452 may be received at a board assembly process 1454 and used to create PCBs, such as a representative PCB 1456, manufactured in accordance with the design information stored within the GERBER file 1452. For example, the GERBER file 1452 may be uploaded to one or more machines to perform various steps of a PCB production process. The PCB 1456 may be populated with electronic components including the package 1440 to form a representative printed circuit assembly (PCA) 1458.

The PCA 1458 may be received at a product manufacturer 1460 and integrated into one or more electronic devices, such as a first representative electronic device 1462 and a second representative electronic device 1464. As an illustrative, non-limiting example, the first representative electronic device 1462, the second representative electronic device 1464, or both, may be selected from a set top box, a music player, a video player, an entertainment unit, a navigation device, a communications device, a personal digital assistant (PDA), a fixed location data unit, and a computer, into which the system 100 of FIG. 1 or at least one of the components thereof, is integrated. As another illustrative, non-limiting example, one or more of the electronic devices 1462 and 1464 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 14 illustrates remote units according to teachings of the disclosure, the disclosure is not limited to these illustrated units. Implementations of the disclosure may be suitably employed in any device which includes active integrated circuitry including memory and on-chip circuitry.

A device that includes the system 100 of FIG. 1 or at least one of the components thereof, may be fabricated, processed, and incorporated into an electronic device, as described in the illustrative manufacturing process 1400. One or more aspects of the implementations disclosed with respect to FIGS. 1-11 may be included at various processing stages, such as within the library file 1412, the GDSII file 1426, and the GERBER file 1452, as well as stored at the memory 1410 of the research computer 1406, the memory 1418 of the design computer 1414, the memory 1450 of the computer 1446, the memory of one or more other computers or processors (not shown) used at the various stages, such as at the board assembly process 1454, and also incorporated into one or more other physical implementations such as the mask 1432, the die 1436, the package 1440, the PCA 1458, other products such as prototype circuits or devices (not shown), or any combination thereof. The process 1400 of FIG. 14 may be performed by a single entity or by one or more entities performing various stages of the manufacturing process 1400.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed implementations is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An apparatus for sensing a data value according to a dual mode sensing scheme, the apparatus comprising:
   a memory cell comprising a magnetic tunnel junction (MTJ) element;
   a reference cell comprising a reference resistor having a reference resistance; and
   a sensing circuit configured to:
      determine whether a resistance of the MTJ element is within a first range of resistance values, within a second range of resistance values, or within a third range of resistance values, wherein resistance values within the second range of resistance values are greater than resistance values in the first range of resistance values, wherein resistance values in the third range of resistance values are greater than the resistance values in the second range of resistance values, and wherein the reference resistance is within the second range of resistance values;
      determine the data value stored at the memory cell according to a first mode of operation responsive to the resistance of the MTJ element being within the first range of resistance values or within the third range of resistance values; and
      determine the data value stored at the memory cell according to a second mode of operation responsive to the resistance of the MTJ element being within the second range of resistance values.

2. The apparatus of claim 1, wherein the sensing circuit comprises:
   a first sense amplifier configured to generate a first sensed output; and
   a second sense amplifier configured to generate a second sensed output, wherein the sensing circuit is further configured to determine whether the first sensed output is different than the second sensed output.

3. The apparatus of claim 2, wherein the MTJ element is configured to have the resistance responsive to receiving a read current, wherein the resistance of the MTJ element is within the first range of resistance values or within the third range of resistance values responsive to the first sensed output being different than the second sensed output, and wherein the resistance of the MTJ element is within the second range of resistance values responsive to the first sensed output being similar to the second sensed output.

4. The apparatus of claim 1, wherein the second mode of operation corresponds to a data-cell-variation-tolerant sensing scheme.

5. The apparatus of claim 1, wherein the sensing circuit further comprises:
a capacitor configured to store a first output voltage of the sensing circuit; and
a first sense amplifier configured to latch a first sensed output, the first sensed output based on the first output voltage and an adjusted first output voltage, and wherein the sensing circuit is further configured to:
change the resistance of the MTJ element to a low resistance level;
sense the adjusted first output voltage, the adjusted first output voltage based at least in part on the low resistance level of the MTJ element; and
determine the data value stored at the memory cell based on the first sensed output.

6. The apparatus of claim 5, wherein the data value stored at the memory cell corresponds to a logical one data value responsive to the first sensed output having a logical high voltage level.

7. The apparatus of claim 5, wherein the data value stored at the memory cell corresponds to a logical zero data value responsive to the first sensed output having a logical low voltage level.

8. The apparatus of claim 5, wherein changing the resistance of the MTJ element to the low resistance level comprises applying a first write current to the MTJ element using a write driver.

9. The apparatus of claim 5, wherein the sensing circuit is further configured to change the resistance of the MTJ element to a high resistance level responsive to the first sensed output having a logical high voltage level.

10. The apparatus of claim 9, wherein changing the resistance of the MTJ element to the high resistance level comprises applying a second write current to the MTJ element using a write driver.

11. A method of sensing a data value stored at a memory cell according to a dual mode sensing scheme, the method comprising:
determining, at a sensing circuit, whether a magnetic tunnel junction (MTJ) element has a resistance that is within a first range of resistance values, within a second range of resistance values, or within a third range of resistance values, the MTJ element included in the memory cell, wherein resistance values within the second range of resistance values are greater than resistance values in the first range of resistance values, wherein resistance values in the third range of resistance values are greater than the resistance values in the second range of resistance values, and wherein a reference resistor has a reference resistance that is within the second range of resistance values;
determining the data value stored at the memory cell according to a first mode of operation responsive to the resistance of the MTJ element being within the first range of resistance values or within the third range of resistance values; and
determining the data value stored at the memory cell according to a second mode of operation responsive to the resistance of the MTJ element being within the second range of resistance values.

12. The method of claim 11, further comprising:
generating a first sensed output at a first sense amplifier of the sensing circuit;
generating a second sensed output at a second sense amplifier of the sensing circuit; and
determining whether the first sensed output is different than the second sensed output.

13. The method of claim 12, wherein the resistance of the MTJ element is within the first range of resistance values or within the third range of resistance values responsive to the first sensed output being different than the second sensed output, and wherein the resistance of the MTJ element is within the second range of resistance values responsive to the first sensed output being similar to the second sensed output.

14. The method of claim 11, wherein the second mode of operation corresponds to a data-cell-variation-tolerant sensing scheme.

15. The method of claim 11, wherein determining the data value stored at the memory cell according to the second mode of operation comprises:
storing a first output voltage of the sensing circuit at a capacitor;
changing the resistance of the MTJ element to a low resistance level;
sensing an adjusted first output voltage, the adjusted first output voltage based at least in part on the low resistance level of the MTJ element;
latching a first sensed output at a first sense amplifier, the first sensed output based on the first output voltage and the adjusted first output voltage; and
determining the data value stored at the memory cell based on the first sensed output.

16. The method of claim 15, wherein the data value stored at the memory cell corresponds to a logical one data value responsive to the first sensed output having a logical high voltage level.

17. The method of claim 15, wherein the data value stored at the memory cell corresponds to a logical zero data value responsive to the first sensed output having a logical low voltage level.

18. The method of claim 15, wherein changing the resistance of the MTJ element to the low resistance level comprises applying a first write current to the MTJ element using a write driver.

19. The method of claim 15, wherein the operations further comprise changing the resistance of the MTJ element to a high resistance level responsive to the first sensed output having a logical high voltage level.

20. The method of claim 19, wherein changing the resistance of the MTJ element to the high resistance level comprises applying a second write current to the MTJ element using a write driver.

21. A non-transitory computer-readable medium comprising instructions for sensing a data value stored at a memory cell according to a dual mode sensing scheme, the instructions, when executed by a processor, cause the processor to perform operations comprising:
determining, at a sensing circuit, whether a magnetic tunnel junction (MTJ) element has a resistance that is within a first range of resistance values, within a second range of resistance values, or within a third range of resistance values, the MTJ element included in the memory cell, wherein resistance values within the second range of resistance values are greater than resistance values in the first range of resistance values, wherein resistance values in the third range of resistance values are greater than the resistance values in the second range of resistance values, and wherein a reference resistor has a reference resistance that is within the second range of resistance values;

determining the data value stored at the memory cell according to a first mode of operation responsive to the resistance of the MTJ element being within the first range of resistance values or within the third range of resistance values; and determining the data value stored at the memory cell according to a second mode of operation responsive to the resistance of the MTJ element being within the second range of resistance values.

22. The non-transitory computer-readable medium of claim 21, wherein the operations further comprise:

generating a first sensed output at a first sense amplifier of the sensing circuit;

generating a second sensed output at a second sense amplifier of the sensing circuit; and determining whether the first sensed output is different than the second sensed output.

23. The non-transitory computer-readable medium of claim 22, wherein the resistance of the MTJ element is within the first range of resistance values or within the third range of resistance values responsive to the first sensed output being different than the second sensed output, and wherein the resistance of the MTJ element is within the second range of resistance values responsive to the first sensed output being similar to the second sensed output.

24. The non-transitory computer-readable medium of claim 21, wherein determining the data value stored at the memory cell according to the second mode of operation comprises:

storing a first output voltage of the sensing circuit at a capacitor;

changing the resistance of the MTJ element to a low resistance level;

sensing an adjusted first output voltage, the adjusted first output voltage based at least in part on the low resistance level of the MTJ element;

latching a first sensed output at a first sense amplifier, the first sensed output based on the first output voltage and the adjusted first output voltage; and determining the data value stored at the memory cell based on the first sensed output.

25. The non-transitory computer-readable medium of claim 24, wherein changing the resistance of the MTJ element to the low resistance level comprises applying a first write current to the MTJ element using a write driver.

26. An apparatus for sensing a data value stored at a memory cell according to a dual mode sensing scheme, the apparatus comprising:

means for determining whether a magnetic tunnel junction (MTJ) element has a resistance that is within a first range of resistance values, within a second range of resistance values, or within a third range of resistance values, the MTJ element included in the memory cell, wherein resistance values within the second range of resistance values are greater than resistance values in the first range of resistance values, wherein resistance values in the third range of resistance values are greater than the resistance values in the second range of resistance values, and wherein a reference resistor has a reference resistance that is within the second range of resistance values;

means for determining the data value stored at the memory cell according to a first mode of operation responsive to the resistance of the MTJ element being within the first range of resistance values or within the third range of resistance values; and means for determining the data value stored at the memory cell according to a second mode of operation responsive to the resistance of the MTJ element being within the second range of resistance values.

27. The apparatus of claim 26, wherein the second mode of operation corresponds to a data-cell-variation-tolerant sensing scheme, and wherein the reference resistor comprises a reference MTJ element.

28. The apparatus of claim 1, wherein the memory cell includes a first access transistor having a gate coupled to a control line, and wherein the reference cell includes a second access transistor having a gate coupled to the control line.

29. The apparatus of claim 1, wherein the sensing circuit includes a first resistive shift element coupled to the reference resistor and a second resistive shift element coupled to the reference resistor.

30. The apparatus of claim 29, the sensing circuit further including a third resistive shift element coupled to the MTJ element.

* * * * *